United States Patent
Furuhata et al.

(10) Patent No.: US 8,004,165 B2
(45) Date of Patent: Aug. 23, 2011

(54) TUNING FORK OSCILLATING PIECE, TUNING FORK OSCILLATOR, AND ACCELERATION SENSOR

(75) Inventors: Makoto Furuhata, Matsumoto (JP); Masahiro Oshio, Shiojiri (JP); Takamitsu Higuchi, Tokyo-to (JP)

(73) Assignee: Seiko Epson Corporation, Tokyo (JP)

( * ) Notice: Subject to any disclaimer, the term of this patent is extended or adjusted under 35 U.S.C. 154(b) by 165 days.

(21) Appl. No.: 12/204,746

(22) Filed: Sep. 4, 2008

(65) Prior Publication Data
US 2009/0058226 A1 Mar. 5, 2009

(30) Foreign Application Priority Data

Sep. 5, 2007 (JP) ................................. 2007-229816
Jul. 15, 2008 (JP) ................................. 2008-183508

(51) Int. Cl.
*H03H 9/21* (2006.01)
(52) U.S. Cl. ...................... 310/370; 331/156; 73/504.02
(58) Field of Classification Search .................. 310/370; 73/504.2; 331/156
See application file for complete search history.

(56) References Cited

U.S. PATENT DOCUMENTS

| 5,635,642 | A | * | 6/1997 | Nonomura et al. | ......... | 73/504.16 |
|---|---|---|---|---|---|---|
| 5,824,900 | A | * | 10/1998 | Konno et al. | ............... | 73/504.16 |
| 6,288,474 | B1 | * | 9/2001 | Ono et al. | ..................... | 310/319 |
| 6,327,908 | B1 | * | 12/2001 | Yachi et al. | ................. | 73/504.16 |
| 6,484,576 | B2 | * | 11/2002 | Yachi et al. | ................. | 73/504.16 |
| 7,053,534 | B2 | * | 5/2006 | Tomikawa et al. | ............. | 310/370 |
| 2003/0058226 | A1 | * | 3/2003 | Bertram et al. | ............. | 345/173 |
| 2006/0090565 | A1 | * | 5/2006 | Ohuchi et al. | .............. | 73/504.16 |

FOREIGN PATENT DOCUMENTS

| JP | 2003-227719 A | 8/2003 |
|---|---|---|
| JP | 2006-346981 A | 12/2006 |
| JP | 2007-267109 A | 10/2007 |
| JP | 2007-285879 A | 11/2007 |

* cited by examiner

*Primary Examiner* — Walter Benson
*Assistant Examiner* — Bryan P Gordon
(74) *Attorney, Agent, or Firm* — Kilpatrick Townsend & Stockton LLP

(57) ABSTRACT

A tuning fork oscillating piece includes: a base; a pair of oscillating arms extending from the base in directions substantially parallel with each other; a drive piezoelectric element provided at least on one main surface or side surface of each of the oscillating arms to allow bending oscillation of the oscillating arms by piezoelectric distortion caused by applied charge; a detection piezoelectric element provided on the surface opposed to the surface of each of the oscillating arms on which the drive piezoelectric element is provided to convert the piezoelectric distortion caused by the bending oscillation of the oscillating arms into charge and output the charge. The drive piezoelectric element has a drive piezoelectric section. The detection piezoelectric element has a detection piezoelectric section. The absolute value of the piezoelectric d constant of the drive piezoelectric section is larger than the absolute value of the piezoelectric d constant of the detection piezoelectric section. The absolute value of the piezoelectric g constant of the detection piezoelectric section is larger than the absolute value of the piezoelectric g constant of the drive piezoelectric section.

11 Claims, 17 Drawing Sheets

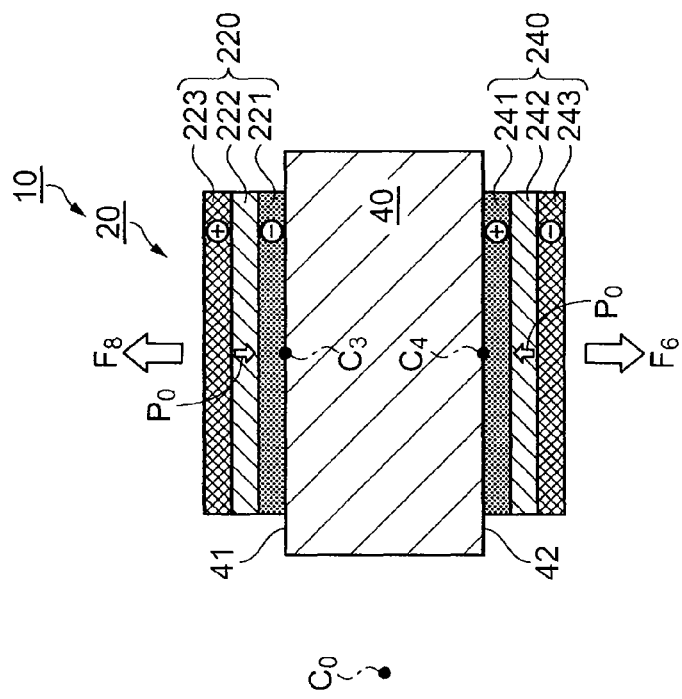
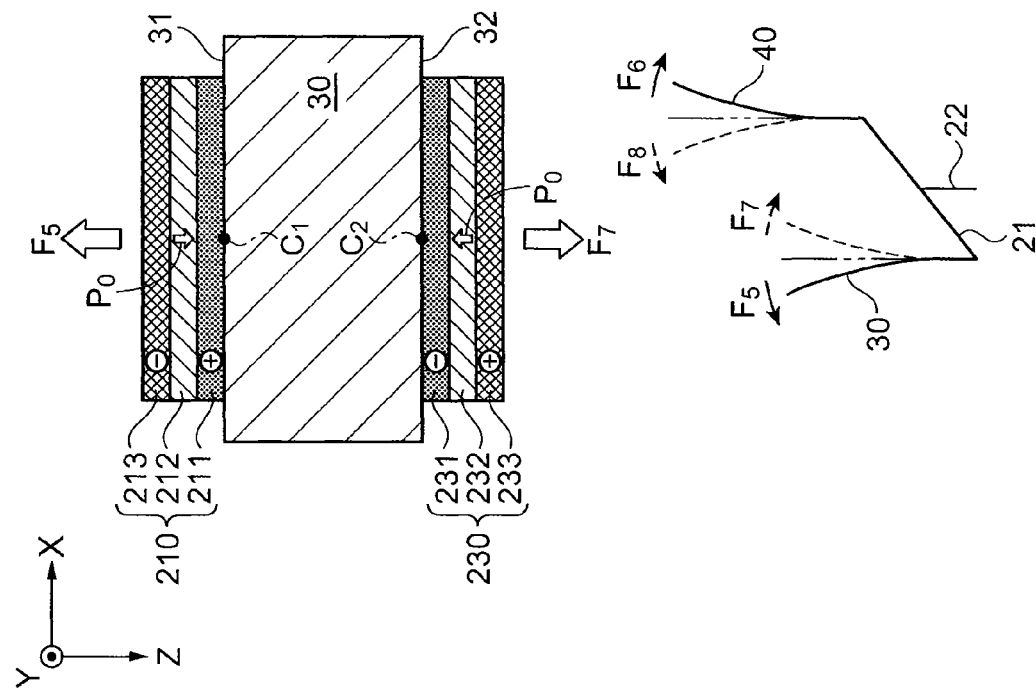
FIG. 9A
FIG. 9B

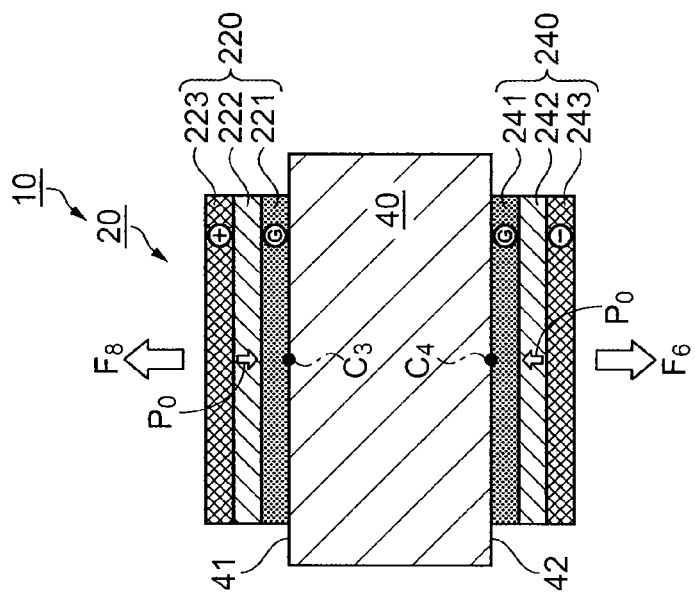
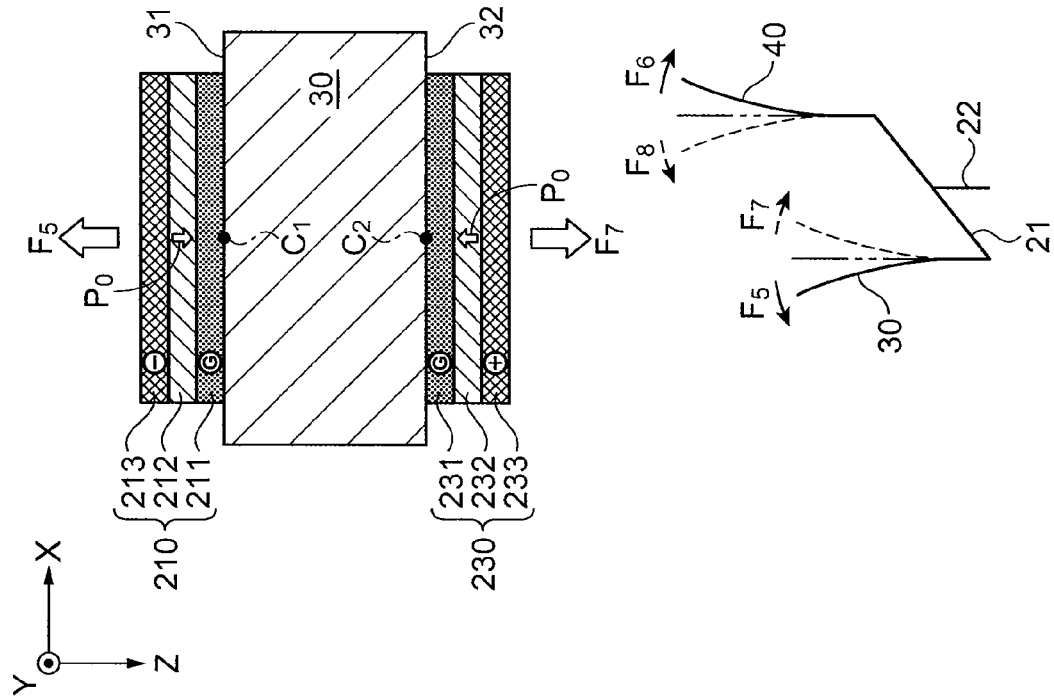
FIG.11A
FIG.11B

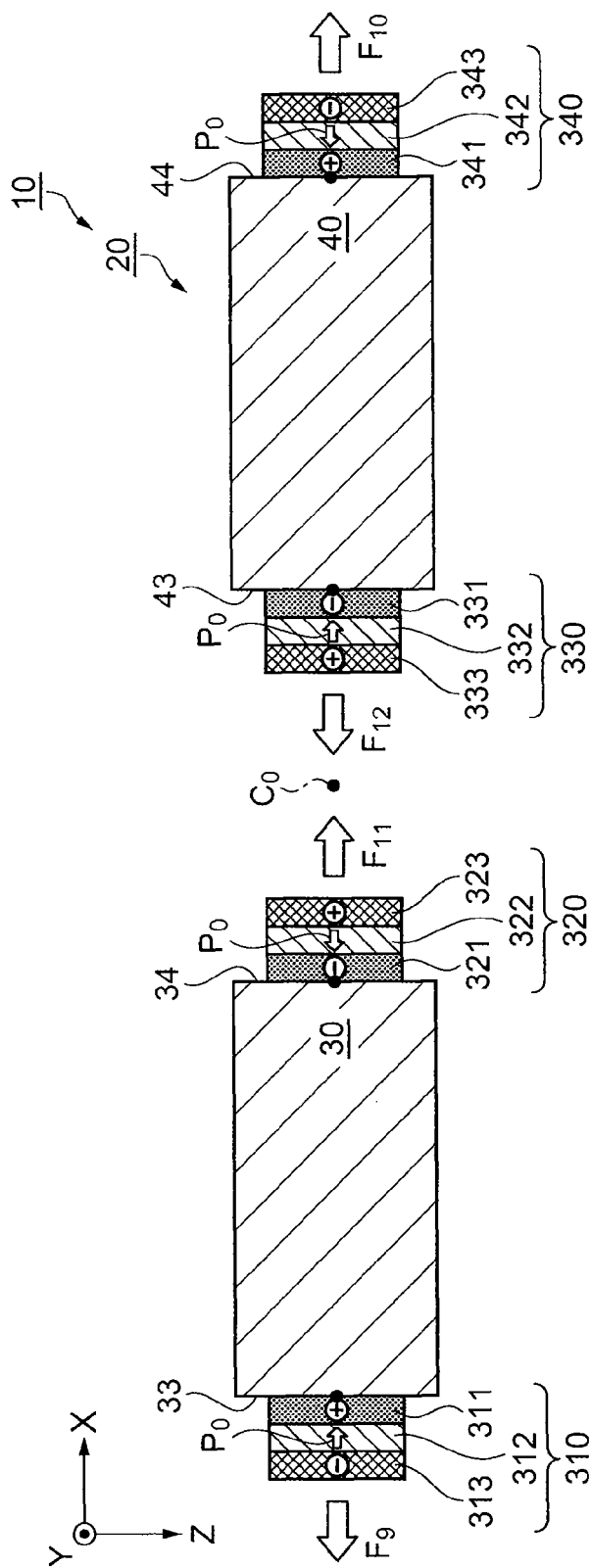
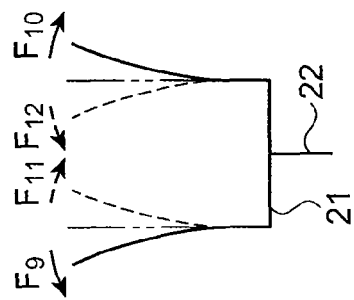
FIG.14A
FIG.14B

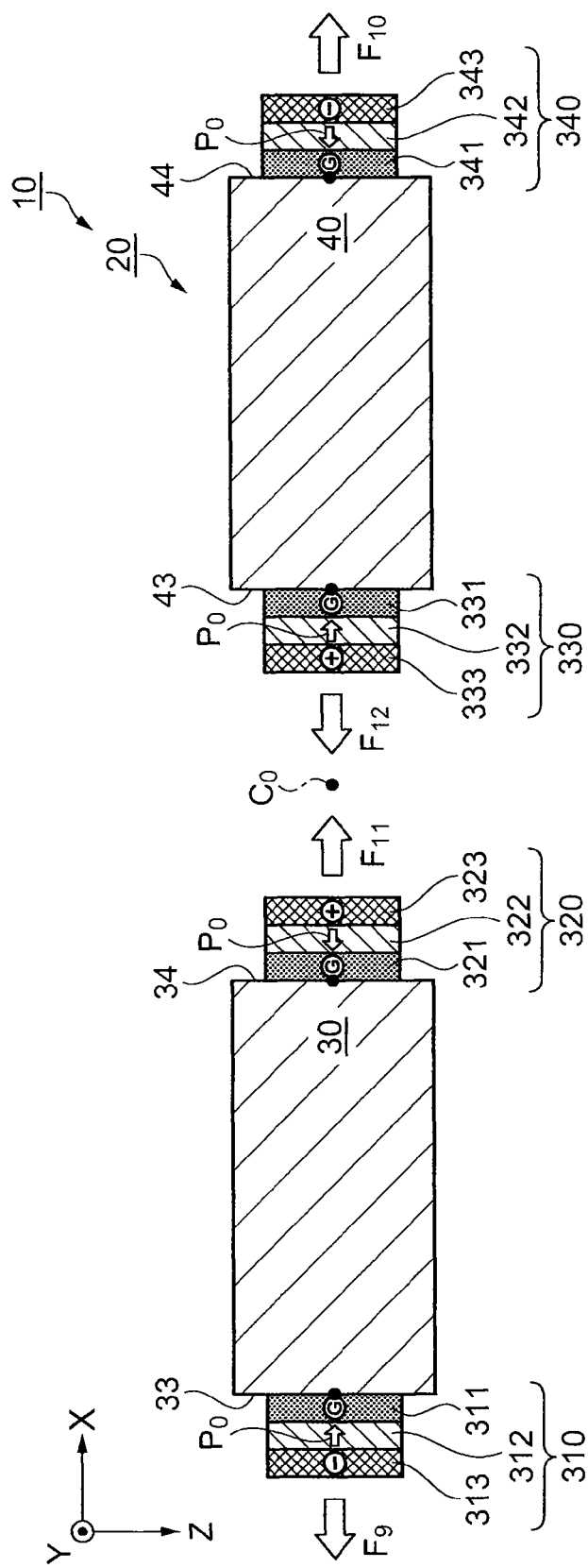
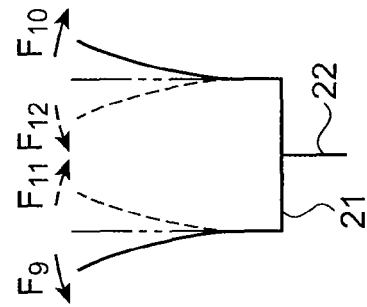
FIG.16A
FIG.16B

TUNING FORK OSCILLATING PIECE, TUNING FORK OSCILLATOR, AND ACCELERATION SENSOR

CROSS-REFERENCES TO RELATED APPLICATIONS

This application claims priority to Japanese Patent Application No. 2007-229816, filed Sep. 5, 2007, and Japanese Patent Application No. 2008-183508, filed Jul. 15, 2008, the disclosures of which are incorporated by reference herein, in their entirety and for all purposes.

BACKGROUND

1. Technical Field

The present invention relates to a tuning fork oscillating piece, a tuning fork oscillator, and an acceleration sensor, which include drive piezoelectric thin film element and detection piezoelectric thin film element.

2. Related Art

Currently, a thin film miniaturized mechanical type resonator (hereinafter referred to as piezoelectric thin film tuning fork oscillating piece) which includes a base, two arms extending from the base (hereinafter referred to as oscillating arms), drive units (hereinafter referred to as drive piezoelectric thin film elements) and detection units (hereinafter referred to as detection piezoelectric thin film elements) provided on the main surfaces of each of two oscillating arms has been disclosed (for example, see JP-A-2003-227719, pp. 11-16, FIGS. 8-13). This type of piezoelectric thin film tuning fork oscillating piece is included in a gyro element and the like. Each of the drive piezoelectric thin film elements has first and second electrodes (hereinafter referred to as drive lower electrode sections), first and second piezoelectric thin films disposed on the first and second drive lower electrode sections (hereinafter referred to as drive piezoelectric thin film sections), third and fourth electrodes disposed on the first and second drive piezoelectric thin film sections (hereinafter referred to as drive upper electrode sections), provided on the inner and outer sides of a center line on the main surface of the oscillating arm units in an extension direction of each oscillating arm unit (hereinafter referred to as main surface center line) such that a clearance is produced between the first and second drive lower electrode sections. Each of the detection piezoelectric thin film elements has fifth electrode disposed away from the first and second drive lower electrode sections (hereinafter referred to as detection lower electrode section), a third piezoelectric thin film disposed on the detection lower electrode section (hereinafter referred to as detection piezoelectric thin film section), and a sixth electrode disposed on the detection piezoelectric thin film section (hereinafter referred to as detection upper electrode section). The drive piezoelectric thin film sections and detection piezoelectric thin film sections are both chiefly made of titanic acid zirconic acid lead (hereinafter referred to as PZT). The inner side herein refers to the side extending toward the center line between the two oscillating arms (between the main surface center lines) from the main surface center lines, and the outer side herein refers to the side extending away from the respective main surface center lines.

According to the piezoelectric thin film turning fork oscillating piece in this related art, the drive piezoelectric thin film sections and the detection piezoelectric thin film sections are both chiefly made of PZT. The absolute value of the piezoelectric d constant, which is the piezoelectric strain constant, of the PZT (hereinafter referred to as "d") is a relatively large value in the absolute values of d of other piezoelectric materials. Thus, PZT has an advantage of converting predetermined electric energy into mechanical energy with high efficiency. However, the absolute value of the piezoelectric g constant, which is the piezoelectric output constant, of PZT (hereinafter referred to as "g") is relatively small in the absolute values of g of other piezoelectric materials. Thus, PZT cannot convert predetermined mechanical energy into electric energy with high efficiency.

Accordingly, the related-art piezoelectric thin film turning fork oscillating piece cannot achieve improvement in both driving efficiency and detection sensitivity.

SUMMARY

It is an advantage of some aspects of the invention to provide a piezoelectric thin film tuning fork oscillating piece, a piezoelectric thin film tuning fork oscillator, and an acceleration sensor, capable of solving at least a part of the above problems.

A piezoelectric thin film tuning fork oscillating piece according to a first aspect of the invention includes: a base; a pair of oscillating arms extending from the base in directions substantially parallel with each other; a drive piezoelectric thin film element provided at least on one main surface or side surface of each of the oscillating arms to allow bending oscillation of the oscillating arms by piezoelectric distortion caused by applied charge; a detection piezoelectric thin film element formed on the surface opposed to the surface of each of the oscillating arms on which the drive piezoelectric thin film element is provided to convert the piezoelectric distortion caused by the bending oscillation of the oscillating arms into charge and output the charge. The drive piezoelectric thin film element has a drive piezoelectric thin film section. The detection piezoelectric thin film element has a detection piezoelectric thin film section. The absolute value of the piezoelectric d constant of the drive piezoelectric thin film section is larger than the absolute value of the piezoelectric d constant of the detection piezoelectric thin film section. The absolute value of the piezoelectric g constant of the detection piezoelectric thin film section is larger than the absolute value of the piezoelectric g constant of the drive piezoelectric thin film section.

According to this structure, the piezoelectric thin film tuning fork oscillating piece includes: a base; a pair of oscillating arms extending from the base in directions substantially parallel with each other; a drive piezoelectric thin film element provided at least on one main surface or side surface of each of the oscillating arms to allow bending oscillation of the oscillating arms by piezoelectric distortion caused by applied charge; a detection piezoelectric thin film element provided on the surface opposed to the surface of each of the oscillating arms on which the drive piezoelectric thin film element is provided to convert the piezoelectric distortion caused by the bending oscillation of the oscillating arms into charge and output the charge.

According to the piezoelectric thin film tuning fork oscillating piece having this structure, the drive piezoelectric thin film element has a drive piezoelectric thin film section. The detection piezoelectric thin film element has a detection piezoelectric thin film section. The absolute value of the piezoelectric d constant of the drive piezoelectric thin film section is larger than the absolute value of the piezoelectric d constant of the detection piezoelectric thin film section. The absolute value of the piezoelectric g constant of the detection piezoelectric thin film section is larger than the absolute value of the piezoelectric g constant of the drive piezoelectric thin film section.

According to the piezoelectric thin film tuning fork oscillating piece having this structure, charges applied to the drive piezoelectric thin film element can be efficiently converted into piezoelectric distortion. Thus, the pair of the oscillating arms can easily perform bending oscillation, and piezoelectric distortion caused by the bending oscillations of the pair of the oscillating arms can be efficiently converted into charges and outputted. Accordingly, the drive efficiency and detection sensitivity can both enhance.

It is preferable that the drive piezoelectric thin film element is provided on one main surface of the respective oscillating arms extending from one main surface of the base, and that the detection piezoelectric thin film element is provided on the other main surface of the oscillating arms extending from the other main surface of the base in the piezoelectric thin film tuning fork oscillating piece.

According to this structure, the drive piezoelectric thin film element is provided on one main surface of the respective oscillating arms extending from one main surface of the base, and the detection piezoelectric thin film element is provided on the other main surface of the oscillating arms extending from the other main surface of the base.

Thus, the respective piezoelectric thin film elements on the one main surface and the other main surface provided on the same side of the two oscillating arms are of the same type.

According to the piezoelectric thin film tuning fork oscillating piece having this structure, bending oscillation containing torsion component of the oscillating arm, which is easily caused when the drive piezoelectric thin film element is disposed on the one main surface of the one oscillating arm and when the drive piezoelectric thin film element is disposed on the other main surface of the other oscillating arm, for example, can be prevented.

Moreover, according to the piezoelectric thin film tuning fork oscillating piece having this structure, the films of the two oscillating arms can be formed at a time by forming methods such as deposition and sputtering. Thus, the respective piezoelectric thin film elements can be easily formed.

It is preferable that the drive piezoelectric thin film element is provided on each of the inner side and outer side of a main surface center line in an extension direction of the oscillating arm on the one main surface of the respective oscillating arms, and that the detection piezoelectric thin film element is provided on each of the inner side and outer side of a main surface center line in the extension direction of the oscillating arm on the other main surface of the respective oscillating arms in the piezoelectric thin film tuning fork oscillating piece.

According to this structure, the drive piezoelectric thin film element is provided on each of the inner side and outer side of a main surface center line in an extension direction of the oscillating arm on the one main surface of the respective oscillating arms, and the detection piezoelectric thin film element is provided on each of the inner side and outer side of a main surface center line in the extension direction of the oscillating arm on the other main surface of the respective oscillating arms.

According to the piezoelectric thin film tuning fork oscillating piece having this structure, the polarity of the charges applied to the drive piezoelectric thin film element on the inner side can be made opposite to that of the drive piezoelectric thin film element on the outer side. Thus, the oscillating arms of the piezoelectric thin film tuning fork oscillating piece can perform bending oscillation with higher efficiency.

It is preferable that the voltages of the drive piezoelectric thin film element and the detection piezoelectric thin film element on the side contacting the oscillating arm is equivalent to each other in the piezoelectric thin film tuning fork oscillating piece.

According to this structure, the voltages of the drive piezoelectric thin film element and the detection piezoelectric thin film element on the side contacting the oscillating arm is equivalent to each other. Thus, generation of piezoelectric distortion component by the piezoelectric operation of the oscillating arms when charges are applied thereto can be prevented.

According to the piezoelectric thin film tuning fork oscillating piece having this structure, therefore, the detection piezoelectric thin film element can convert piezoelectric distortion containing little piezoelectric distortion component which is unnecessary into charges and output the charges. In addition, the piezoelectric thin film tuning fork oscillating piece can decrease spurious. Accordingly, output with reduced noise can be obtained.

A piezoelectric thin film tuning fork oscillator according to a second aspect of the invention includes: the piezoelectric thin film tuning fork oscillating piece described above; and a package which accommodates the piezoelectric thin film tuning fork oscillating piece in the hermetically sealed interior of the package.

According to this structure, the piezoelectric thin film tuning fork oscillator includes the piezoelectric thin film tuning fork oscillating piece described above, and a package which accommodates the piezoelectric thin film tuning fork oscillating piece in the hermetically sealed interior of the package. Since the piezoelectric thin film tuning fork oscillator is accommodated in a package which hermetically seals the piezoelectric thin film tuning fork oscillating piece. Thus, stable bending oscillation can be maintained.

An acceleration sensor includes the piezoelectric thin film tuning fork oscillating piece described above as an acceleration detecting element.

According to this structure, the acceleration sensor includes the piezoelectric thin film tuning fork oscillating piece described above as an acceleration detecting element. Thus, the change in the bending oscillation number of the piezoelectric thin film tuning fork oscillating piece caused by the change in acceleration can be detected with high efficiency. Accordingly, acceleration can be detected with high sensitivity.

BRIEF DESCRIPTION OF THE DRAWINGS

The invention will be described with reference to the accompanying drawings, wherein like numbers reference like elements.

FIGS. 9A and 9B schematically illustrate oscillation of the piezoelectric thin film crystal oscillating piece.

FIGS. 11A and 11B schematically illustrate oscillation of the piezoelectric thin film crystal oscillating piece.

FIGS. 14A and 14B schematically illustrate oscillation of the piezoelectric thin film crystal oscillating piece.

FIGS. 16A and 16B schematically illustrate oscillation of the piezoelectric thin film crystal oscillating piece.

DESCRIPTION OF THE EXEMPLARY EMBODIMENTS

Embodiments according to the invention are hereinafter described with reference to the drawings. The figures for the description are only schematic figures which use vertical and horizontal reduction scales different from those of the actual components and parts for simplifying the explanation.

First Embodiment

Figure 1:
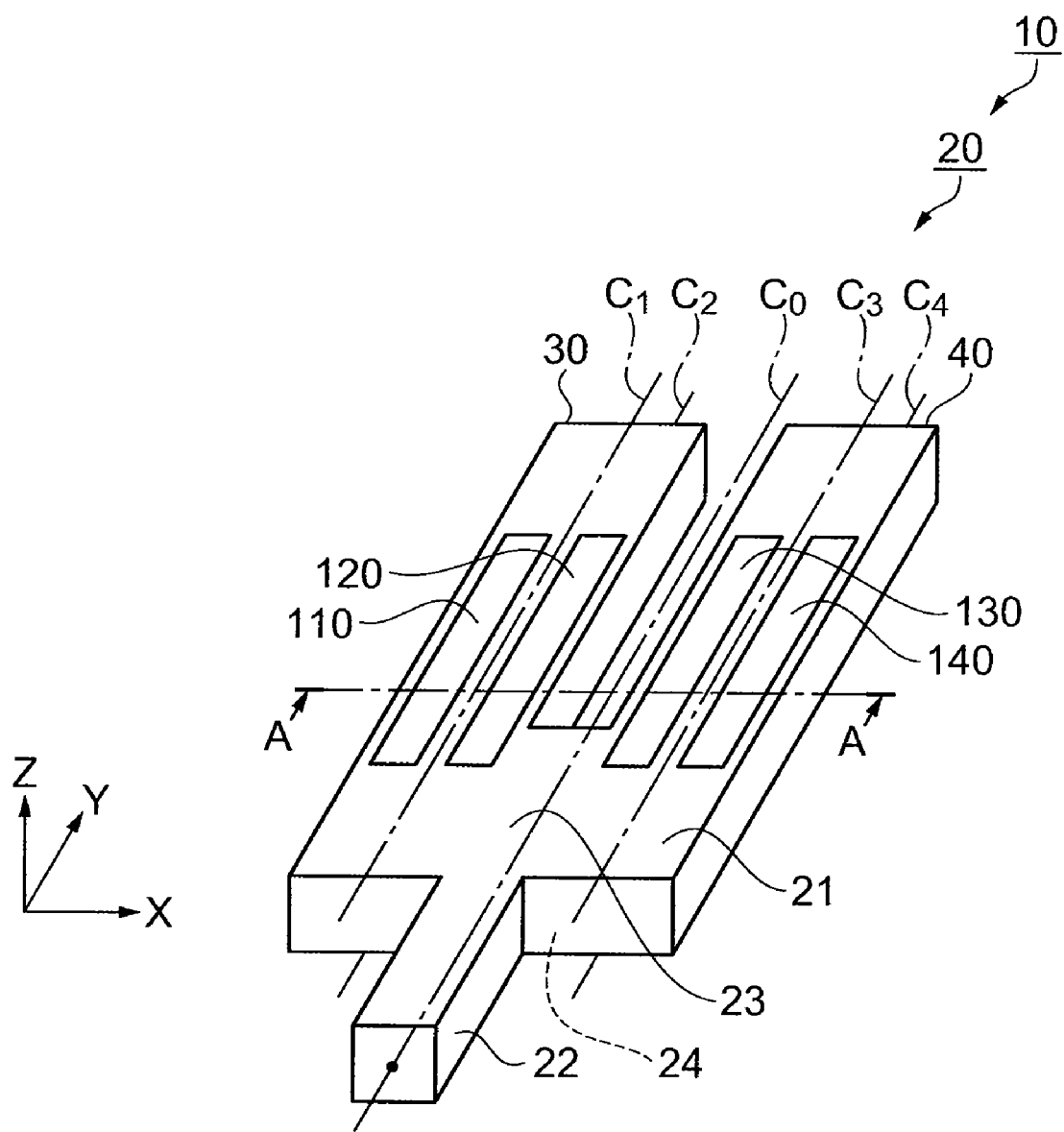
FIG. 1 is a perspective view showing a piezoelectric thin film tuning fork oscillating piece according to a first embodiment.
Figure 2:
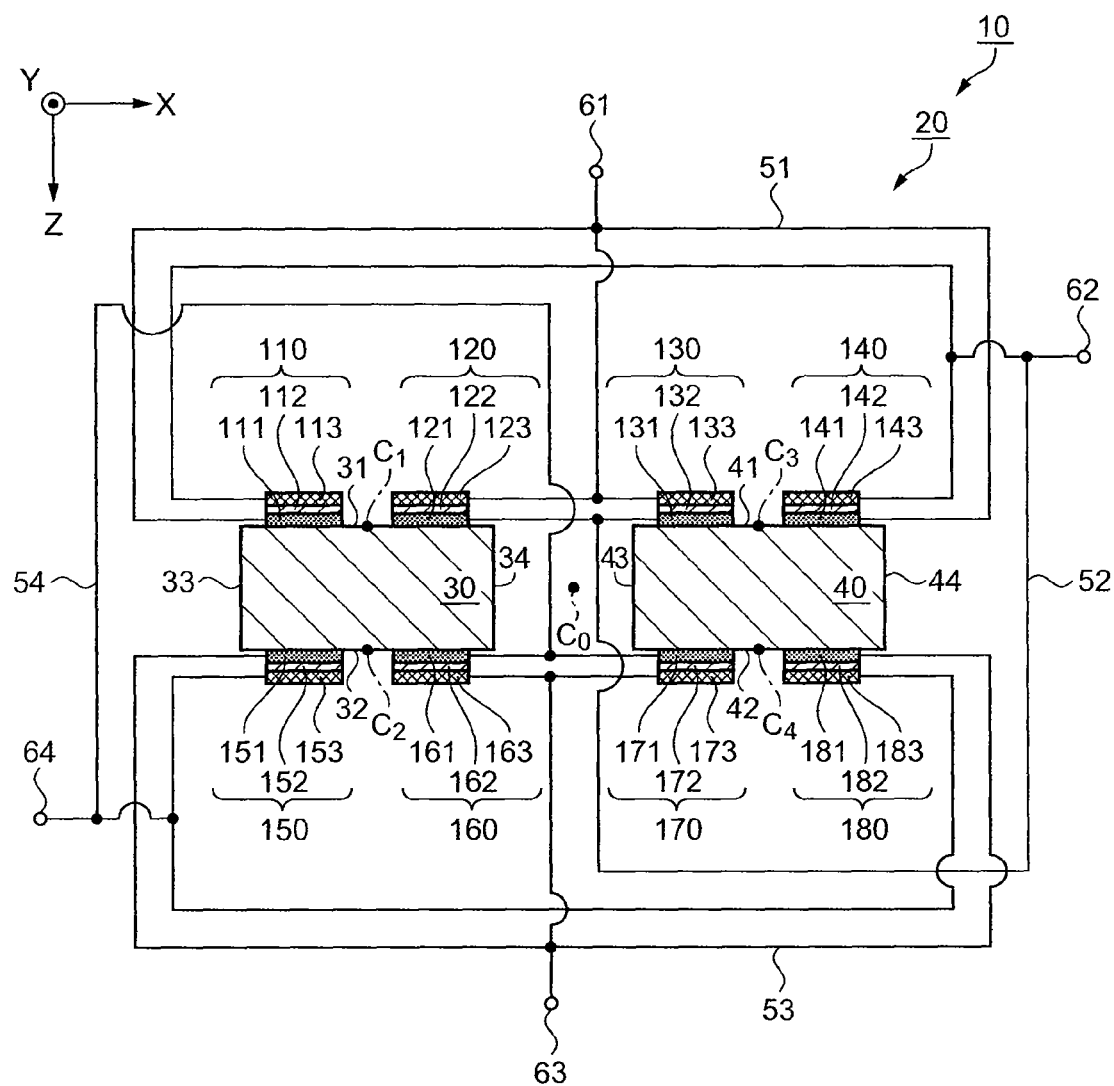
FIG. 2 is a cross-sectional view taken along a line A-A in FIG. 1, showing connections between respective piezoelectric thin film elements.

FIG. 1 is a perspective view illustrating a piezoelectric thin film tuning fork oscillating piece according to a first embodiment. FIG. 2 is a cross-sectional view taken along a line A-A in FIG. 1, showing connections of respective piezoelectric thin film elements. The tuning fork oscillating piece body of the piezoelectric thin film tuning fork piece in this embodiment is constituted by a crystal oscillating piece body having preferable frequency and temperature characteristics as piezoelectric body, for example.

As illustrated in FIGS. 1 and 2, the piezoelectric thin film crystal oscillating piece 10 as a piezoelectric thin film tuning fork oscillating piece is a tuning fork type oscillating piece having a pair of oscillating arms 30 and 40 extending from one side of a base 21 of a crystal oscillating piece body 20 substantially in parallel with each other.

A support member 22 is provided on the base 21 in the direction opposite to the extending direction of the oscillating arms 30 and 40.

According to the oscillating arms 30 and 40, a surface substantially along a surface defined by the extension direction of the oscillating arms 30 and 40 and the disposition direction of the oscillating arms 30 and 40 (direction crossing the oscillating arms 30 and 40) is a main surface, and a surface substantially orthogonal to the disposition direction of the oscillating arms 30 and 40 is a side surface. A main surface 31 as one main surface and a main surface 32 as the other main surface opposed to the main surface 31, and side surfaces 33 and 34 opposed to each other are formed on the surface of the oscillating arm 30.

Also, a main surface 41 as one main surface and a main surface 42 as the other main surface opposed to the main surface 41, and side surfaces 43 and 44 opposed to each other are formed on the surface of the oscillating arm 40.

Piezoelectric thin film elements 110, 120, 130, 140, 150, 160, 170, and 180 are formed on the main surfaces 31, 32, 41, and 42.

The pair of the oscillating arms 30 and 40 are disposed symmetric with respect to a center line C0 between the oscillating arm 30 and the oscillating arm 40.

The extending direction of the oscillating arms 30 and 40 and the longitudinal direction of the piezoelectric thin film crystal oscillating piece 10 correspond to Y axis direction, the width direction of the piezoelectric thin film crystal oscillating piece 10 orthogonal to the Y axis direction corresponds to X axis direction, and the thickness direction of the piezoelectric thin film crystal oscillating piece 10 orthogonal to the X and Y axes corresponds to Z axis direction.

The respective piezoelectric thin film elements as drive piezoelectric thin film elements (hereinafter referred to as drive elements) and as detection piezoelectric thin film elements (hereinafter referred to as detection elements) formed on the main surfaces 31, 32, 41, and 42 are now discussed.

As illustrated in FIGS. 1 and 2, the piezoelectric thin film element 110 has a substantially rectangular flat shape disposed on the outer side of a main surface center line C1 on the main surface 31 in the Y axis direction.

The piezoelectric thin film element 120 has a substantially rectangular flat shape disposed on the inner side of the main surface center line C1 on the main surface 31 in the Y axis direction.

The piezoelectric thin film element 150 has a substantially rectangular flat shape disposed on the outer side of a main surface center line C2 on the main surface 32 in the Y axis direction.

The piezoelectric thin film element 160 has a substantially rectangular flat shape disposed on the inner side of the main surface center line C2 on the main surface 32 in the Y axis direction.

The piezoelectric thin film element 130 has a substantially rectangular flat shape disposed on the inner side of a main surface center line C3 on the main surface 41 in the Y axis direction.

The piezoelectric thin film element 140 has a substantially rectangular flat shape disposed on the outer side of the main surface center line C3 on the main surface 41 in the Y axis direction.

The piezoelectric thin film element 170 has a substantially rectangular flat shape disposed on the inner side of a main surface center line C4 on the main surface 42 in the Y axis direction.

The piezoelectric thin film element 180 has a substantially rectangular flat shape disposed on the outer side of the main surface center line C4 on the main surface 42 in the Y axis direction.

The piezoelectric thin film element 110 and the piezoelectric thin film element 120 have flat shapes substantially linear-symmetric with respect to the main surface center line C1.

The piezoelectric thin film element 150 and the piezoelectric thin film element 160 have flat shapes substantially linear-symmetric with respect to the main surface center line C2.

The piezoelectric thin film element 130 and the piezoelectric thin film element 140 have flat shapes substantially linear-symmetric with respect to the main surface center line C3.

The piezoelectric thin film element 170 and the piezoelectric thin film element 180 have flat shapes substantially linear-symmetric with respect to the main surface center line C4.

The inner side refers to the side disposed toward the center line C0 from the main surface center lines C1, C2, C3, and C4 (between the main surface center line C1 and the main surface center line C3, and between the main surface center line C2 and the main surface center line C4). The outer side refers to the side disposed away from the center line C0 from the main surface center lines C1, C2, C3, and C4.

The method for determining which of the piezoelectric thin film elements 110, 120, 130, 140, 150, 160, 170, and 180 are used as the drive elements or the detection elements is now discussed. Table 1 shows the positioning of the drive elements and detection elements on the respective main surfaces.

piezoelectric thin film elements 170 and 180 as the detection elements on the main surface 42.

Thus, the piezoelectric thin film crystal oscillating piece 10 has the piezoelectric thin film elements 110, 120, 130, and 140 as the drive elements, and the piezoelectric thin film elements 150, 160, 170, and 180 as the detection elements disposed opposed to each other.

The main surface 31 of the oscillating arm 30 and the main surface 41 of the oscillating arm 40 extend from one main surface 23 of the base 21. The main surface 32 of the oscillating arm 30 and the main surface 42 of the oscillating arm 40 extend from the other main surface 24 of the base 21. That is, the main surface 31 and the main surface 41 are disposed on the one main surface 23 side of the base, and the main surface 32 and the main surface 42 are disposed on the other main surface 24 side of the base 21.

TABLE 1

| crystal oscillating piece 10 sample No. | piezoelectric thin film element | | | | | | | |
|---|---|---|---|---|---|---|---|---|
| | 110 | 120 | 130 | 140 | 150 | 160 | 170 | 180 |
| 1 | drive element | drive element | drive element | drive element | detect element | detect element | detect element | detect element |
| 2 | drive element | drive element | detect element | detect element | detect element | detect element | drive element | drive element |
| 3 | drive element | drive element | drive element | detect element | detect element | detect element | detect element | drive element |
| 4 | drive element | drive element | drive element | detect element | detect element | detect element | drive element | detect element |
| 5 | drive element | drive element | detect element | drive element | detect element | detect element | detect element | drive element |
| 6 | drive element | drive element | detect element | drive element | detect element | detect element | drive element | detect element |
| 7 | drive element | detect element | detect element | drive element | detect element | drive element | detect element | detect element |
| 8 | drive element | detect element | detect element | drive element | detect element | drive element | detect element | drive element |
| 9 | drive element | detect element | detect element | drive element | drive element | detect element | drive element | detect element |
| 10 | drive element | detect element | detect element | drive element | drive element | detect element | detect element | drive element |
| 11 | drive element | detect element | drive element | detect element | detect element | drive element | detect element | drive element |
| 12 | drive element | detect element | drive element | detect element | drive element | detect element | drive element | detect element |
| 13 | detect element | drive element | drive element | detect element | detect element | drive element | drive element | detect element |

According to this embodiment, the piezoelectric thin film elements 110, 120, 130, 140, 150, 160, 170, and 180 are determined as the drive elements or detection elements as shown in Sample Nos. 1 through 13 in Table 1 to produce the piezoelectric thin film crystal oscillating piece 10. The Sample No. 1 piezoelectric thin film crystal oscillating piece 10 is now discussed as a typical example.

This piezoelectric thin film crystal oscillating piece 10 includes the piezoelectric thin film elements 110, 120, 130 and 140 as the drive elements, and the piezoelectric thin film elements 150, 160, 170, and 180 as the detection elements.

The piezoelectric thin film crystal oscillating piece 10 has the piezoelectric thin film elements 110 and 120 as the drive elements on the main surface 31, and the piezoelectric thin film elements 130 and 140 as the drive elements on the main surface 41. Also, the piezoelectric thin film crystal oscillating piece 10 has the piezoelectric thin film elements 150 and 160 as the detection elements on the main surface 32, and the The details of the piezoelectric thin film element 110 and the piezoelectric thin film element 150 are now described as example of the drive elements and detection elements with reference to FIG. 2.

The piezoelectric thin film element 110 has a lower electrode section 111 as a drive lower electrode section formed on the main surface 31, a piezoelectric thin film section 112 as a drive piezoelectric thin film section formed on the lower electrode section 111, and an upper electrode section 113 as a drive upper electrode section formed on the piezoelectric thin film section 112.

The piezoelectric thin film element 150 has a lower electrode section 151 as a detection lower electrode section formed on the main surface 32, a piezoelectric thin film section 152 as a detection piezoelectric thin film section formed on the lower electrode section 151, and an upper electrode section 153 as a detection upper electrode section formed on the piezoelectric thin film section 152.

The lower electrode section 111 is made of Pt, the piezoelectric thin film section 112 is made of PZT, and the upper electrode section 113 is made of Al.

The lower electrode section 151 is made of Mo, the piezoelectric thin film section 152 is made of ZnO, and the upper electrode section 153 is made of Al.

The absolute value of the piezoelectric d constant, which is the piezoelectric strain constant, of PZT (hereinafter referred to as d(PZT)) is about $130\times10^{-12}$[m/V], and the absolute value of the piezoelectric d constant of ZnO (hereinafter referred to as d(ZnO)) is about $6\times10^{-12}$[m/V]. Thus, the relation of these absolute values can be expressed as d(PZT)>d(ZnO).

The absolute value of the piezoelectric g constant, which is the piezoelectric output constant, of PZT (hereinafter referred to as g(PZT)) is about $12\times10^{-3}$[Vm/N], and the absolute value of the piezoelectric g constant of ZnO (hereinafter referred to as g(ZnO)) is about $55\times10^{-3}$[Vm/N]. Thus, the relation of these absolute values can be expressed as g(ZnO)>g(PZT).

The grid lengths of the Pt and PZT are substantially equivalent to each other. Thus, the orientations of the piezoelectric thin film sections 112, 122, 132, and 142 formed on the lower electrode sections 111, 121, 131, and 141 enhance, and the absolute values of d(PZT) and g(PZT) of the piezoelectric thin film sections 112, 122, 132, and 142 increase.

Also, the grid lengths of the Mo and ZnO are substantially equivalent to each other. Thus, the orientations of the piezoelectric thin film sections 152, 162, 172, and 182 formed on the lower electrode sections 151, 161, 171, and 181 enhance, and the absolute values of d(ZnO) and g(ZnO) of the piezoelectric thin film sections 152, 162, 172, and 182 increase.

The films of the piezoelectric thin film elements 110, 120, 130, 140, 150, 160, 170, and 180 are formed by sputtering. Also, these film elements are shaped by photo-lithographing or etching.

According to this embodiment, piezoelectric thin film elements 110, 120, 130, 140, 150, 160, 170, and 180 are not formed on the side surfaces 33, 34, 43, and 44, but only on the main surfaces 31, 32, 41, and 42.

Moreover, in this embodiment, the piezoelectric thin film elements 110, 120, 130, 140 as the drive elements and the piezoelectric thin film elements 150, 160, 170, and 180 as detection elements are provided on the surfaces of the main surfaces 31 and 41 and on the main surfaces of 32 and 42 on the same sides of the crystal oscillating piece body 20, respectively. Thus, sputtering, photo-lithographing, and etching can be performed on the oscillating arms 30 and 40 at a time or by easy methods.

The connection between the electrode sections of the drive elements and the connection between the electrode sections of the detection elements are now sequentially described with reference to FIG. 2.

As for the drive elements, the lower electrode sections 111 and 141, the upper electrode sections 123 and 133, and a connection pin 61 are connected via a connection electrode 51. The upper electrode sections 113 and 143 and the lower electrode sections 121 and 131 having polarity opposite to that of the electrode sections 111, 141, 123, and 133, and a connection pin 62 are connected via a connection electrode 52.

As for the detection elements, the lower electrode sections 151 and 181, the upper electrode sections 163 and 173, and a connection pin 63 are connected via a connection electrode 53. The upper electrode sections 153 and 183 and the lower electrode sections 161 and 171 having polarity opposite to that of the electrode sections 151, 181, 163, and 173, and a connection pin 64 are connected via a connection electrode 54.

Figure 3:
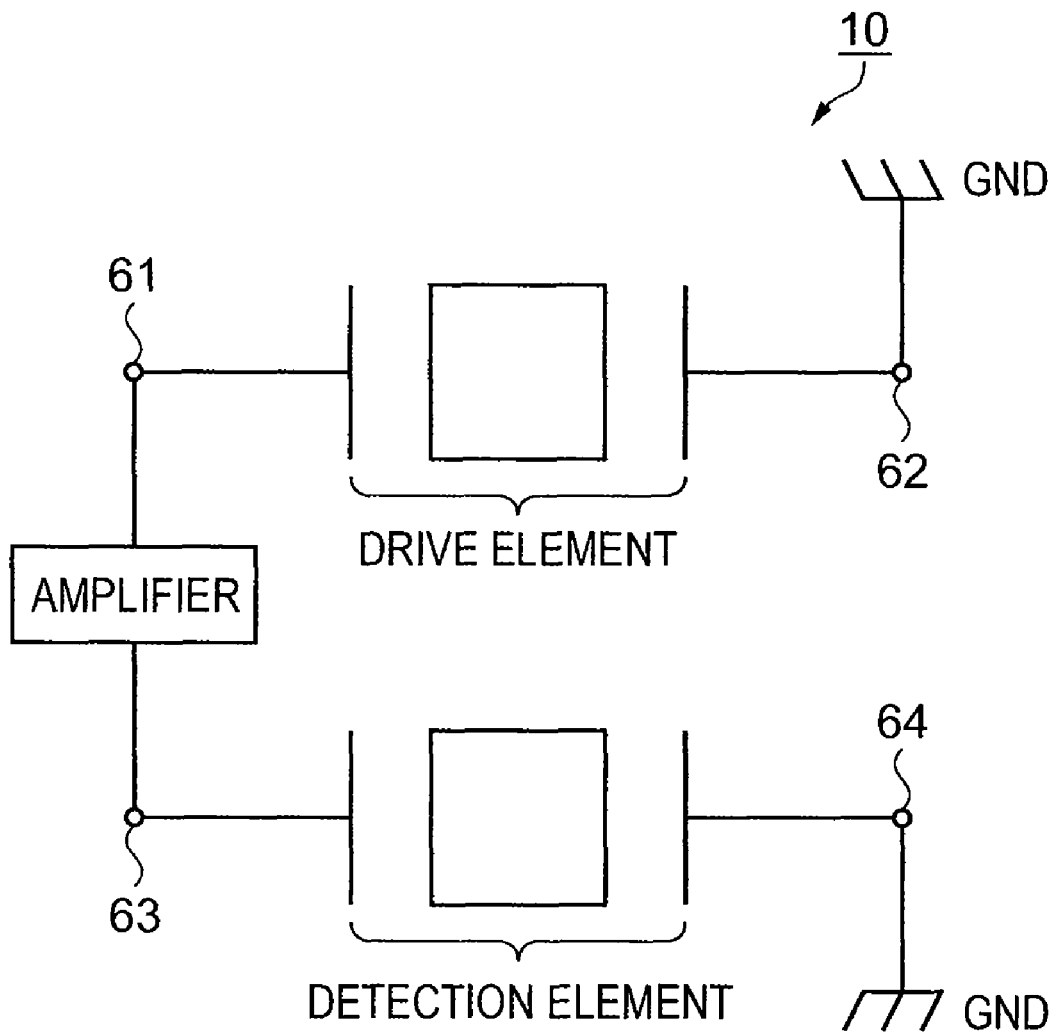
FIG. 3 is an equivalent circuit diagram showing a condition of connection between a piezoelectric thin film crystal oscillating piece and an amplifier.

FIG. 3 is an equivalent circuit illustrating a condition of connecting the piezoelectric thin film crystal oscillating piece 10 to an amplifier. As illustrated in FIGS. 2 and 3, the drive elements (piezoelectric thin film elements 110, 120, 130, 140) are connected with the amplifier via the connection pin 61, and the detection elements (piezoelectric thin films 150, 160, 170, 180) are connected with the amplifier via the connection pin 63. The piezoelectric thin film sections 112, 122, 132, and 142 and the piezoelectric thin films 152, 162, 172, and 182 are joined by mechanical energy. The oscillating circuit is constructed in this manner.

The oscillation of the piezoelectric thin film crystal oscillating piece 10 is now discussed.

Figure 4A:
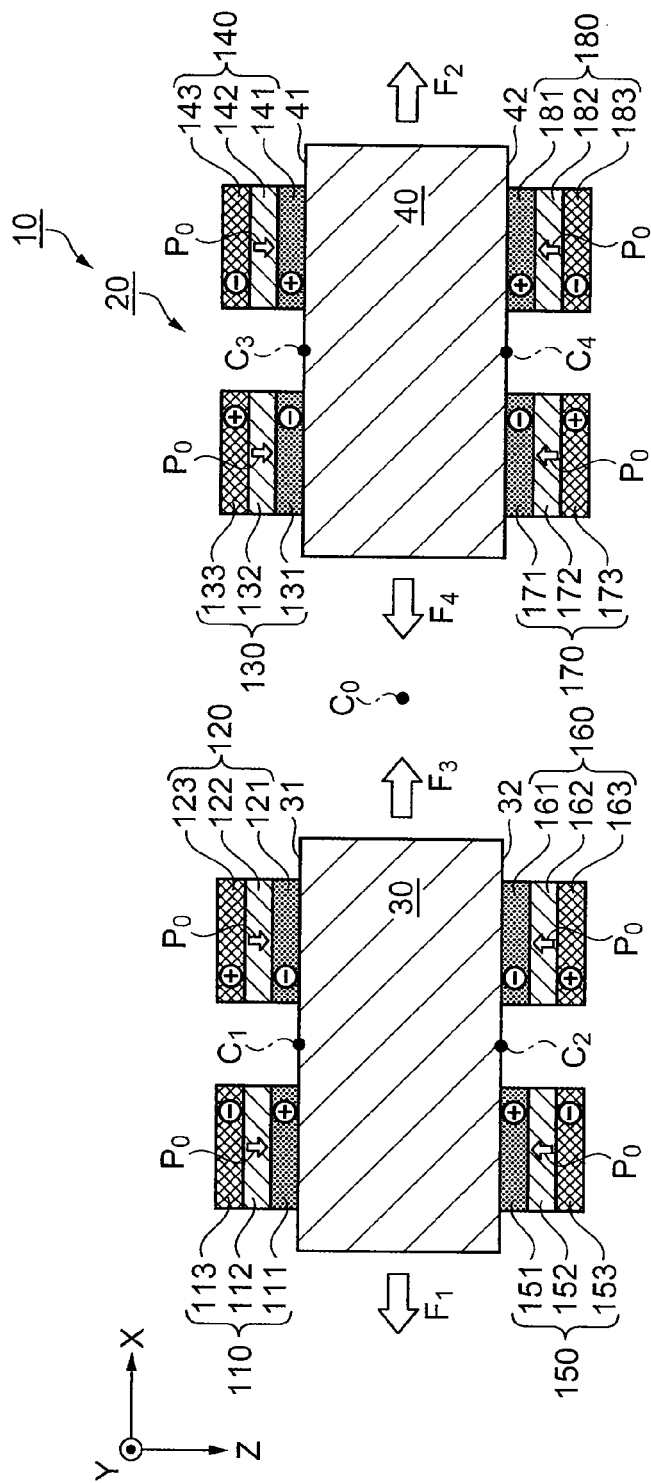
FIGS. 4A and 4B schematically illustrate oscillation of the piezoelectric thin film crystal oscillating piece.
Figure 4B:
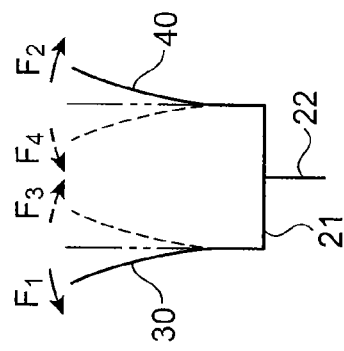

FIGS. 4A and 4B schematically illustrate oscillation direction of the piezoelectric thin film crystal oscillating piece 10. FIG. 4A is a cross-sectional view taken along a line A-A in FIG. 1, and FIG. 4B schematically illustrates oscillation direction of the piezoelectric thin film crystal oscillating piece 10. A first condition is now explained with reference to FIGS. 4A and 4B.

Plus (+) voltage is applied to the lower electrode sections 111 and 141 and the upper electrode sections 123 and 133, and minus (−) voltage is applied to the upper electrode sections 113 and 143 and the lower electrode sections 121 and 131. In this case, the polarization direction of the piezoelectric thin film sections 112, 122, 132, and 142 is the thickness direction of the piezoelectric thin film sections 112, 122, 132 and 142 as indicated by arrows $P_0$.

The operation of the oscillating arm 30 is now explained. According to this structure, plus voltage is applied to the lower electrode section 111, and minus voltage is applied to the upper electrode sections 113. In this case, the piezoelectric thin film section 112 expands in the Z axis direction parallel to the polarization direction, and contracts in the X axis and Y axis directions.

On the other hand, minus voltage is applied to the lower electrode section 121, and plus voltage is applied to the upper electrode sections 123. In this case, the piezoelectric thin film section 122 contracts in the Z axis direction, and expands in the X axis and Y axis directions.

The degree of distortion of this expansion or contraction is proportional to the size of the piezoelectric thin film section in the direction of distortion of expansion and contraction. The piezoelectric thin film sections 112 and 122 are designed such that the size in the Y axis direction becomes the largest. Thus, the distortion in the Y axis direction is the largest.

Accordingly, the piezoelectric thin film section 112 formed outside the main surface center line C1 contracts the most largely in the Y axis direction. The piezoelectric thin film section 122 formed inside the main surface center line C1 expands the most largely in the Y axis direction. Thus, the oscillating arm 30 on which the piezoelectric thin film sections 112 and 122 are formed displaces in a direction indicated by an arrow F1.

By the displacement of the oscillating arm 30 in the direction of the arrow F1, the piezoelectric thin film section 152 formed on the oscillating arm 30 contracts in the Y axis direction and expands in the X axis and Z axis directions. As a result, plus (+) charges are generated on the lower electrode section 151, and minus (−) charges are generated on the upper electrode section 153.

The piezoelectric thin film section 162 expands in the Y axis direction, and contracts in the X axis and Z axis directions. As a result, minus charges are generated on the lower electrode section 161, and plus charges are generated on the upper electrode section 163.

The operation of the oscillating arm 40 is now explained. According to this structure, plus voltage is applied to the lower electrode section 141, and minus voltage is applied to the upper electrode section 143. In this case, the piezoelectric thin film section 142 expands in the Z axis direction parallel to the polarization direction, and contracts in the X axis and Y axis directions.

On the other hand, minus voltage is applied to the lower electrode section 131, and plus voltage is applied to the upper electrode sections 133. In this case, the piezoelectric thin film section 132 contracts in the Z axis direction, and expands in the X axis and Y axis directions.

The piezoelectric thin film sections 132 and 142 are also designed such that the size in the Y axis direction becomes the largest. Thus, the distortion in the Y axis direction is the largest.

Accordingly, the piezoelectric thin film section 142 formed outside the main surface center line C3 contracts the most largely in the Y axis direction. The piezoelectric thin film section 132 formed inside the main surface center line C3 expands the most largely in the Y axis direction. Thus, the oscillating arm 40 on which the piezoelectric thin film sections 132 and 142 are formed displaces in a direction indicated by an arrow F2.

By the displacement of the oscillating arm 40 in the direction of the arrow F2, the piezoelectric thin film section 182 formed on the oscillating arm 40 contracts in the Y axis direction and expands in the X axis and Z axis directions. As a result, plus charges are generated on the lower electrode section 181, and minus charges are generated on the upper electrode section 183. The piezoelectric thin film section 172 expands in the Y axis direction, and contracts in the X axis and Z axis directions. As a result, minus charges are generated on the lower electrode section 171, and plus charges are generated on the upper electrode section 173.

A second condition is now explained (not shown). In the second condition, voltage having the phase opposite to that of the voltage in the first condition is applied to the upper electrode sections and lower electrode sections. More specifically, minus voltage is applied to the lower electrode sections 111 and 141 and the upper electrode sections 123 and 133, and plus voltage is applied to the upper electrode sections 113 and 143 and the lower electrode sections 121 and 131.

The operation of the oscillating arm 30 is now explained. According to this structure, minus voltage is applied to the lower electrode section 111, and plus voltage is applied to the upper electrode sections 113. In this case, the piezoelectric thin film section 112 contracts in the Z axis direction parallel to the polarization direction, and expands in the X axis and Y axis directions.

On the other hand, plus voltage is applied to the lower electrode section 121, and minus voltage is applied to the upper electrode sections 123. In this case, the piezoelectric thin film section 122 expands in the Z axis direction, and contracts in the X axis and Y axis directions. The piezoelectric thin film section 112 formed outside the main surface center line C1 expands the most largely in the Y axis direction. The piezoelectric thin film section 122 formed inside the main surface center line C1 contracts the most largely in the Y axis direction. Thus, the oscillating arm 30 on which the piezoelectric thin film sections 112 and 122 are formed displaces in a direction indicated by an arrow F3.

By the displacement of the oscillating arm 30 in the direction of the arrow F3, the piezoelectric thin film section 152 formed on the oscillating arm 30 expands in the Y axis direction and contracts in the X axis and Z axis directions. As a result, minus charges are generated on the lower electrode section 151, and plus charges are generated on the upper electrode section 153. Also, the piezoelectric thin film section 162 contracts in the Y axis direction, and expands in the X axis and Z axis directions. As a result, plus charges are generated on the lower electrode section 161, and minus charges are generated on the upper electrode section 163.

The operation of the oscillating arm 40 is now explained. According to this structure, minus voltage is applied to the lower electrode section 141, and plus voltage is applied to the upper electrode sections 143. In this case, the piezoelectric thin film section 142 contracts in the Z axis direction parallel to the polarization direction, and expands in the X axis and Y axis directions.

On the other hand, plus voltage is applied to the lower electrode section 131, and minus voltage is applied to the upper electrode sections 133. In this case, the piezoelectric thin film section 132 expands in the Z axis direction, and contracts in the X axis and Y axis directions.

The piezoelectric thin film section 142 formed outside the main surface center line C3 expands the most largely in the Y axis direction. The piezoelectric thin film section 132 formed inside the main surface center line C3 contracts the most largely in the Y axis direction. Thus, the oscillating arm 40 on which the piezoelectric thin film sections 132 and 142 are formed displaces in a direction indicated by an arrow F4.

By the displacement of the oscillating arm 40 in the direction of the arrow F4, the piezoelectric thin film section 182 formed on the oscillating arm 40 expands in the Y axis direction and contracts in the X axis and Z axis directions. As a result, minus charges are generated on the lower electrode section 181, and plus charges are generated on the upper electrode section 183. Also, the piezoelectric thin film section 172 contracts in the Y axis direction, and expands in the X axis and Z axis directions. As a result, plus charges are generated on the lower electrode section 171, and minus charges are generated on the upper electrode section 173.

By repeating the first condition and second condition described above (that is, by applying alternating current voltage), the oscillating arms 30 and 40 repeat bending oscillation in the X axis direction.

The following advantages are offered according to the first embodiment.

(1) The alternating current voltages having the opposite phases applied to the drive piezoelectric thin film sections 112 and 114 and the drive piezoelectric thin film sections 122 and 132 generate distortion (piezoelectric distortion) in the opposite directions for the drive piezoelectric thin film sections 112 and 142 and for the drive piezoelectric thin film sections 122 and 132.

As a result, the oscillating arm 30 and the oscillating arm 40 perform bending oscillations in the opposite directions. By these bending oscillations, the detection piezoelectric thin film sections 152, 162, 172, and 182 on the detection piezoelectric thin film elements 150, 160, 170, and 180 are deformed.

The absolute value of g(ZnO) of the detection piezoelectric thin film sections 152, 162, 172, and 182 is larger than the absolute value of g(PZT) of the drive piezoelectric thin film sections 112, 122, 132, and 142. Thus, the deformation (piezoelectric distortion) having a predetermined degree given to the detection piezoelectric thin film sections 152, 162, 172, 182 is converted into alternating current voltage at the detection piezoelectric thin film sections 152, 162, 172, and 182 with high efficiency and outputted. Accordingly, the piezoelectric thin film crystal oscillating piece 10 can achieve improvement in both driving efficiency and detection sensitivity.

(2) According to the piezoelectric thin film crystal oscillating piece 10, the lower electrode sections 111, 121, 131, and 141 of the piezoelectric thin film crystal oscillating piece 10 is made of Pt, and the piezoelectric thin film sections 112, 122, 132, and 142 formed on the lower electrode sections 111, 121, 131, and 141 are made of PZT.

The grid lengths of Pt and PZT included in the piezoelectric thin film crystal oscillating piece 10 are substantially equivalent to each other. Thus, the orientations of the piezoelectric thin film sections 112, 122, 132, and 142 formed on the lower electrode sections 111, 121, 131, and 141 enhance, and the absolute value of d(PZT) of the piezoelectric thin film sections 112, 122, 132, and 142 increase. Thus, the piezoelectric thin film crystal oscillating piece 10 can convert predetermined electric energy into mechanical energy with high efficiency.

(3) According to the piezoelectric thin film crystal oscillating piece 10, the lower electrode sections 151, 161, 171, and 181 of the piezoelectric thin film crystal oscillating piece 10 are made of Mo, and the piezoelectric thin film sections 152, 162, 172, and 182 formed on the lower electrode sections 151, 161, 171, and 181 are made of ZnO.

The grid lengths of Mo and ZnO included in the piezoelectric thin film crystal oscillating piece 10 are substantially equivalent to each other. Thus, the orientations of the piezoelectric thin film sections 152, 162, 172, and 182 formed on the lower electrode sections 151, 161, 171, and 181 enhance, and the absolute value of g(ZnO) of the piezoelectric thin film sections 152, 162, 172, and 182 increase. Thus, the piezoelectric thin film crystal oscillating piece 10 can convert predetermined electric energy into mechanical energy with high efficiency.

(4) The piezoelectric thin film crystal oscillating piece 10 can change the polarity of the applied voltage between the drive piezoelectric thin film sections 122 and 132 disposed inside and the drive piezoelectric thin film sections 112 and 142 disposed outside. Thus, the piezoelectric thin film crystal oscillating piece 10 can perform bending oscillation for the respective oscillating arms with higher efficiency than in the structure having only one drive piezoelectric thin film section on each oscillating arm.

(5) According to the piezoelectric thin film crystal oscillating piece 10, the drive piezoelectric thin film sections 122 and 132 disposed inside and the drive piezoelectric thin film sections 112 and 142 disposed outside are formed on the main surfaces 31 and 41 positioned on the same side. Thus, deformation causing torsion of the oscillating arms 30 and 40 in a direction other than the X axis direction or the like can be prevented.

Accordingly, the piezoelectric thin film crystal oscillating piece 10 can prevent occurrence of unnecessary piezoelectric distortion component of the detection piezoelectric thin film sections 152, 162, 172, and 182.

Modification Example

A modified example of the first embodiment is now described.

Figure 5:
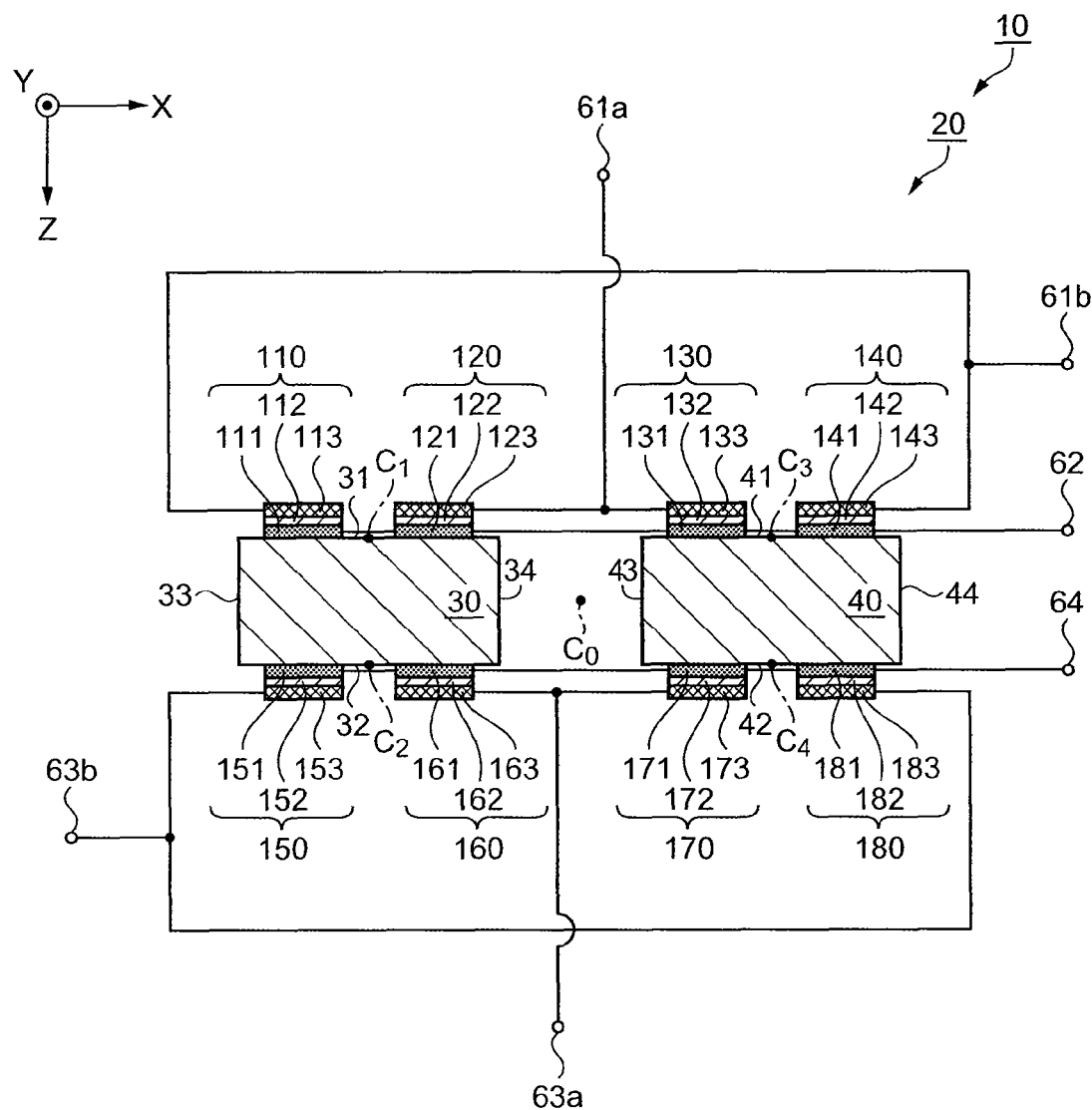
FIG. 5 illustrates connections of respective piezoelectric thin film elements in a modified example of the first embodiment.

FIG. 5 illustrates connections of respective piezoelectric thin film elements in the modified example of the first embodiment.

The connections between the electrode sections of the drive elements and between the electrode sections of the detection elements of the piezoelectric thin film crystal oscillating piece 10 in the modified example are sequentially explained with reference to FIG. 5.

As for the drive elements, the lower electrode sections 111, 121, 131, and 141 are connected with one another, and joined to the connection pin 62. The upper electrode sections 113 and 143 are connected with one another, and joined to a connection pin 61b.

The upper electrode sections 123 and 133 are connected with one another, and joined to a connection pin 61a.

As for the detection elements, the lower electrode sections 151, 161, 171, and 181 are connected with one another, and joined to the connection pin 64. The upper electrode sections 153 and 183 are connected with one another, and joined to a connection pin 63b.

The upper electrode sections 163 and 173 are connected with one another, and joined to a connection pin 63a.

The connection pins 61a, 61b, 63a, and 63b are connected with the amplifier. The connection pin 62 is so constructed as to have voltage equivalent to that of the connection pin 64.

The oscillation of the piezoelectric thin film crystal oscillating piece 10 is now discussed.

Figure 6A:
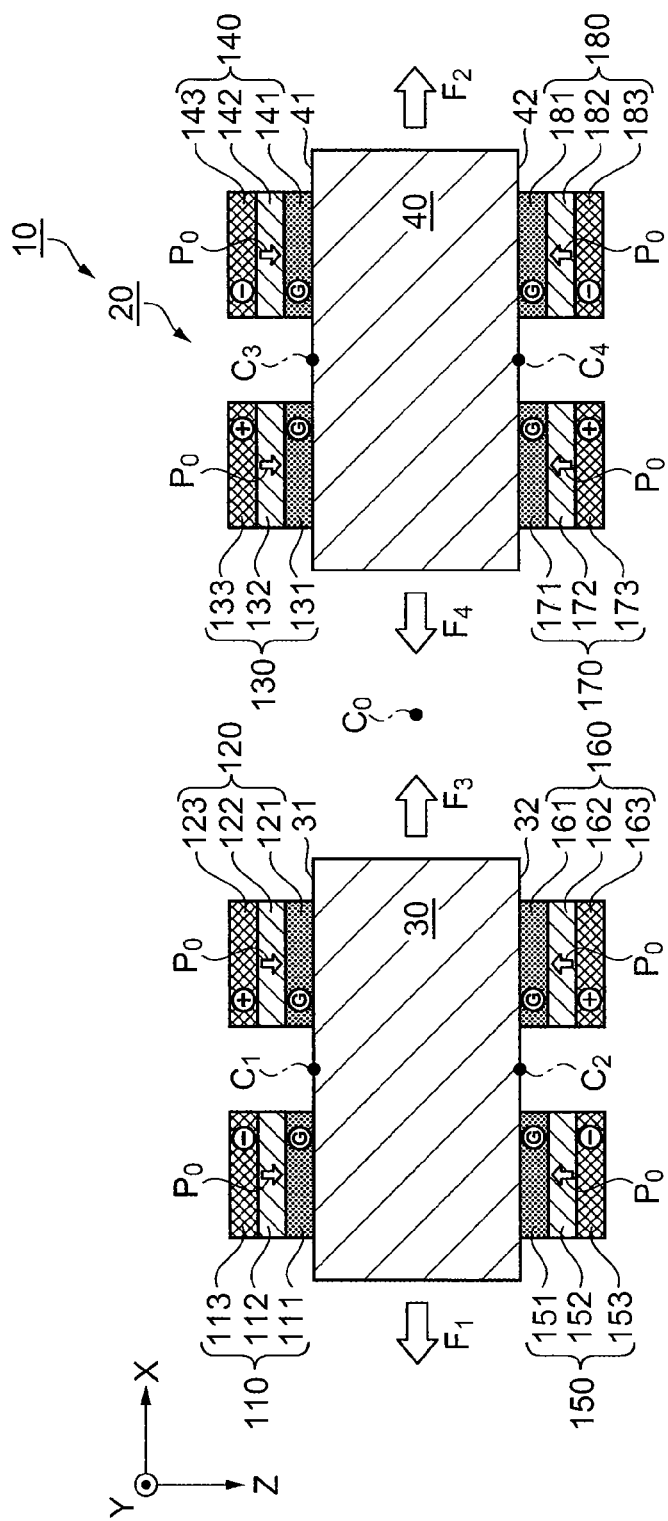
FIGS. 6A and 6B schematically illustrate oscillation of the piezoelectric thin film crystal oscillating piece.
Figure 6B:
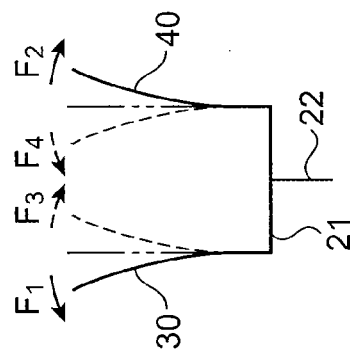

FIGS. 6A and 6B schematically illustrate oscillation of the piezoelectric thin film crystal oscillating piece 10. FIG. 6A is a cross-sectional view taken along the line A-A in FIG. 1, and FIG. 6B schematically shows the oscillation direction of the piezoelectric thin film crystal oscillating piece 10. The parts different from those in the first embodiment are chiefly explained herein.

The difference between the modified example and the first embodiment is that the voltages of the respective lower electrode sections of the respective oscillating arms are equivalent to one another.

A first condition is now explained with reference to FIGS. 6A and 6B.

Ground (G) voltage is applied to the lower electrode sections 111, 121, 131, and 141, and minus (−) voltage on the minus side of the ground voltage is applied to the upper electrode sections 113 and 143.

Also, plus (+) voltage on the plus side of the ground voltage is applied to the upper electrode sections 123 and 133. In this case, the polarization direction of the piezoelectric thin film sections 112, 122, 132, and 142 is the thickness direction of the piezoelectric thin film sections 112, 122, 132 and 142 as indicated by the arrows $P_0$ similarly to the first embodiment.

Thus, similarly to the first embodiment, the piezoelectric thin film section 112 formed outside the main surface center line C1 on the oscillating arm 30 contracts the most largely in the Y axis direction. Also, the piezoelectric thin film section 122 formed inside the main surface center line C1 expands the most largely in the Y axis direction. Thus, the oscillating arm 30 on which the piezoelectric thin film sections 112 and 122 are formed displaces in the direction indicated by the arrow F1.

By the displacement of the oscillating arm 30 in the direction of the arrow F1, the piezoelectric thin film section 152 formed on the oscillating arm 30 contracts in the Y axis direction and expands in the X axis and Z axis directions. As a result, ground charges are generated on the lower electrode section 151, and minus charges on the minus side of the ground charges are generated on the upper electrode section 153.

The piezoelectric thin film section 162 expands in the Y axis direction, and contracts in the X axis and Z axis directions. As a result, ground charges are generated on the lower electrode section 161, and plus charges on the plus side of the ground charges are generated on the upper electrode section 163.

Similarly to the first embodiment, the piezoelectric thin film section 142 formed outside the main surface center line C3 on the oscillating arm 40 contracts the most largely in the Y axis direction. Also, the piezoelectric thin film section 132 formed inside the main surface center line C3 expands the most largely in the Y axis direction. Thus, the oscillating arm 40 on which the piezoelectric thin film sections 132 and 142 are formed displaces in the direction indicated by the arrow F2.

By the displacement of the oscillating arm 40 in the direction of the arrow F2, the piezoelectric thin film section 182 formed on the oscillating arm 40 contracts in the Y axis direction and expands in the X axis and Z axis directions. As a result, ground charges are generated on the lower electrode section 181, and minus charges on the minus side of the ground charges are generated on the upper electrode section 183.

The piezoelectric thin film section 172 expands in the Y axis direction, and contracts in the X axis and Z axis directions. As a result, ground charges are generated on the lower electrode section 171, and plus charges on the plus side of the ground charges are generated on the upper electrode section 173.

A second condition is now discussed.

In the second condition, ground voltage is applied to the lower electrode sections 111, 121, 131, and 141, and voltage having the phase opposite to that in the first condition is applied to the upper electrode sections 113, 143, 123, and 133. In this case, the oscillating arm 30 displaces in the direction indicated by the arrow F3, and the oscillating arm 40 displaces in the direction indicated by the arrow F4 similarly to the second condition in the first embodiment.

By the displacement of the oscillating arm 30 in the direction of the arrow F3, ground charges are generated on the lower electrode section 151, and plus charges on the plus side of the ground charges are generated on the upper electrode section 153. Also, ground charges are generated on the lower electrode section 161, and minus charges on the minus side of the ground charges are generated on the upper electrode section 163.

By the displacement of the oscillating arm 40 in the direction of the arrow F4, ground charges are generated on the lower electrode section 181, and plus charges on the plus side of the ground charges are generated on the upper electrode section 183. Also, ground charges are generated on the lower electrode section 171, and minus charges on the minus side of the ground charges are generated on the upper electrode section 173.

By repeating the first condition and second condition discussed above, the oscillating arms 30 and 40 repeat bending oscillation in the X axis direction similarly to the first embodiment.

As described above, according to the piezoelectric thin film crystal oscillating piece 10 in the modified example of the first embodiment, the voltages (charges) of the lower electrode sections 111, 121, 131, 141, 151, 161, 171, and 181 disposed on the side contacting the oscillating arms 30 and 40 are equivalent to one another. Thus, generation of piezoelectric distortion component produced by piezoelectric operations of the oscillating arms 30 and 40 caused by applied voltage can be prevented. Thus, the piezoelectric distortion generated by the bending oscillation of the oscillating arms 30 and 40 of the piezoelectric thin film crystal oscillating piece 10 contains little piezoelectric distortion component generated by the piezoelectric operations of the oscillating arms 30 and 40. Thus, the piezoelectric thin film elements 150, 160, 170, and 180 as the detection elements of the piezoelectric thin film crystal oscillating piece 10 converts the piezoelectric distortion containing little piezoelectric distortion component as unnecessary component into charges and outputs the charges. In addition, the piezoelectric thin film crystal oscillating piece 10 can decrease spurious as discussed above. Accordingly, output with reduced noise can be obtained.

Second Embodiment

In this embodiment, the same explanation as that in the first embodiment is not repeated, and only different points are described.

Figure 7:
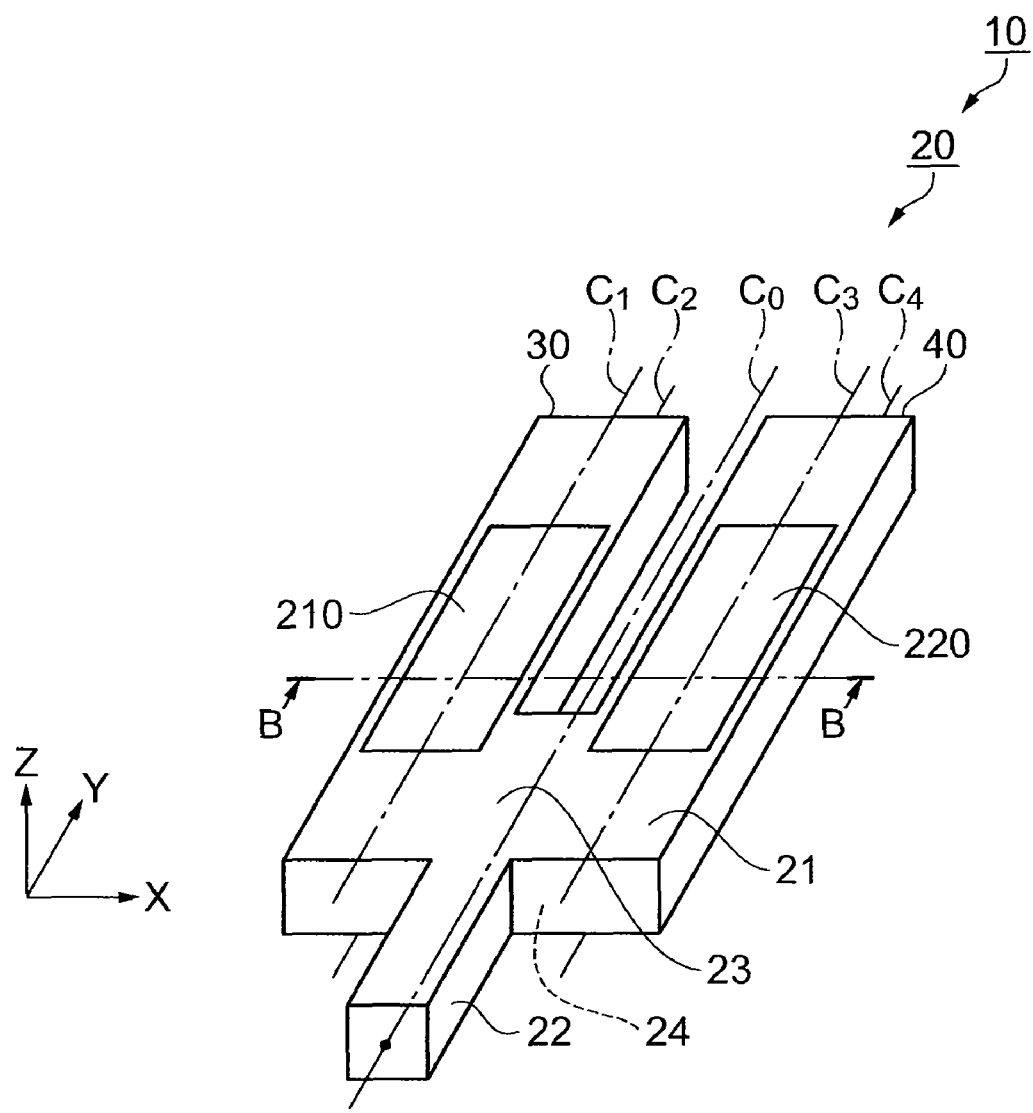
FIG. 7 is a perspective view showing a piezoelectric thin film tuning fork oscillating piece according to a second embodiment.
Figure 8:
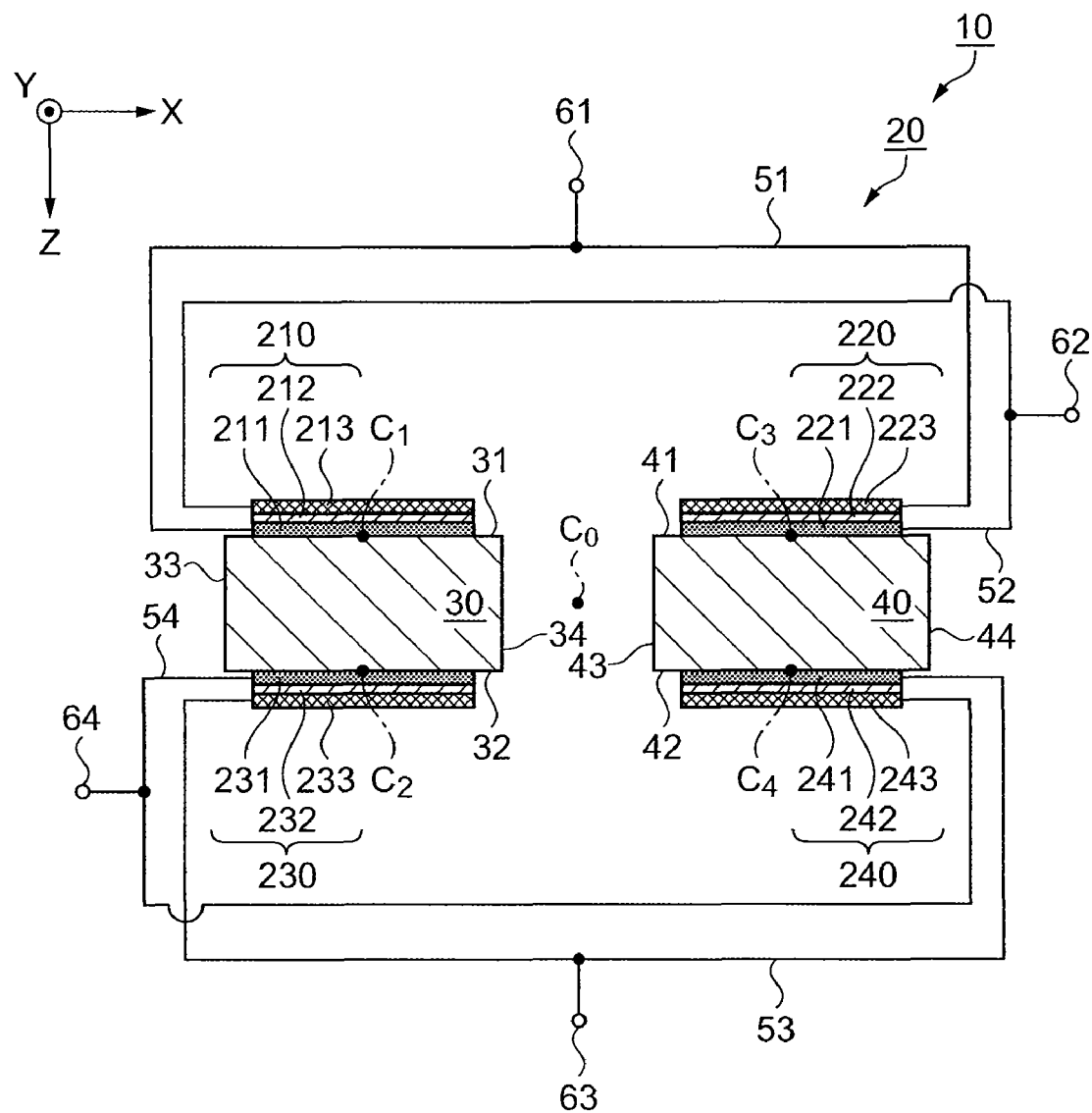
FIG. 8 is a cross-sectional view taken along a line B-B in FIG. 7, showing connections between respective piezoelectric thin film elements.

FIG. 7 is a perspective view illustrating a piezoelectric thin film tuning fork oscillating piece in a second embodiment. FIG. 8 is a cross-sectional view taken along a line B-B in FIG. 7, illustrating connections of respective piezoelectric thin film elements.

As illustrated in FIGS. 7 and 8, a piezoelectric thin film element 210 has a substantially rectangular flat shape which is substantially linear-symmetric with respect to the main center line C1 on the main surface 31.

A piezoelectric thin film element 230 has a substantially rectangular flat shape which is substantially linear-symmetric with respect to the main center line C2 on the main surface 32.

A piezoelectric thin film element 220 has a substantially rectangular flat shape which is substantially linear-symmetric with respect to the main center line C3 on the main surface 41.

A piezoelectric thin film element 240 has a substantially rectangular flat shape which is substantially linear-symmetric with respect to the main center line C4 on the main surface 42.

The method for determining which of the piezoelectric thin film elements 210, 220, 230, and 240 are used as the drive elements or the detection elements is now discussed. Table 2 shows the positioning of the drive elements and detection elements on the respective main surfaces.

TABLE 2

| crystal oscillating piece 10 | piezoelectric thin film element | | | |
|---|---|---|---|---|
| sample No. | 210 | 220 | 230 | 240 |
| 14 | drive element | drive element | detect element | detect element |
| 15 | drive element | detect element | detect element | drive element |

According to this embodiment, the piezoelectric thin film elements 210, 220, 230, and 240 are determined as the drive elements or detection elements as shown in Sample Nos. 14 and 15 in Table 2 to produce the piezoelectric thin film crystal oscillating piece 10.

The piezoelectric thin film crystal oscillating piece 10 of sample No. 14 is now discussed as a typical example. This piezoelectric thin film crystal oscillating piece 10 has the piezoelectric thin film elements 210 and 220 as the drive elements, and the piezoelectric thin film elements 230 and 240 as the detection elements.

The piezoelectric thin film crystal oscillating piece 10 has the piezoelectric thin film element 210 as the drive element on the main surface 31, and the piezoelectric thin film element 220 as the drive element on the main surface 41. Also, the piezoelectric thin film crystal oscillating piece 10 has the piezoelectric thin film element 230 as the detection element on the main surface 32, and the piezoelectric thin film element 240 as the detection element on the main surface 42.

According to the piezoelectric thin film crystal oscillating piece 10 having this arrangement, the piezoelectric thin film elements 210 and 220 as the drive elements are opposed to the piezoelectric thin film elements 230 and 240 as the detection elements.

The connection between the electrode sections of the drive elements and the connection between the electrode sections of the detection elements are now sequentially described with reference to FIG. 8.

As for the drive elements, the lower electrode section 211, the upper electrode section 223, and the connection pin 61 are connected via the connection electrode 51. The upper electrode section 213 and the lower electrode section 221 having polarity opposite to that of the electrode sections 211, 223, and the connection pin 62 are connected via the connection electrode 52.

As for the detection elements, the lower electrode section 231, the upper electrode section 243, and the connection pin 64 are connected via the connection electrode 54. The upper electrode section 233 and the lower electrode section 241 having polarity opposite to that of the electrode sections 231, 243, and the connection pin 63 are connected via the connection electrode 53.

The oscillation of the piezoelectric thin film crystal oscillating piece 10 is now discussed. FIGS. 9A and 9B schematically illustrate oscillation direction of the piezoelectric thin film crystal oscillating piece 10. FIG. 9A is a cross-sectional view taken along a line B-B in FIG. 7, and FIG. 9B schematically illustrates oscillation direction of the piezoelectric thin film crystal oscillating piece 10. A third condition is now explained with reference to FIGS. 9A and 9B. Plus voltage is applied to the lower electrode section 211 and the upper electrode section 223, and minus voltage is applied to the upper electrode section 213 and the lower electrode section 221. In this case, the polarization direction of the piezoelectric thin film sections 212, 222, 232, and 242 corresponds to the thickness direction of the piezoelectric thin film sections 212, 222, 232, and 242 in the direction indicated by the arrows $P_0$.

The operation of the oscillating arm 30 is now explained. According to this structure, plus voltage is applied to the lower electrode section 211, and minus voltage is applied to the upper electrode sections 213. In this case, the piezoelectric thin film section 212 expands in the Z axis direction parallel to the polarization direction, and contracts in the X axis and Y axis directions. As a result, the piezoelectric thin film section 212 formed on the main surface 31 contracts the most largely in the Y axis direction. Thus, the oscillating arm 30 on which the piezoelectric thin film section 212 is formed displaces in a direction indicated by an arrow F5.

By the displacement of the oscillating arm 30 in the direction of the arrow F5, the piezoelectric thin film section 232 formed on the oscillating arm 30 expands in the Y axis direction and contracts in the X axis and Z axis directions. As a result, minus charges are generated on the lower electrode section 231, and plus charges are generated on the upper electrode section 233.

The operation of the oscillating arm 40 is now explained. According to this structure, minus voltage is applied to the lower electrode section 221, and plus voltage is applied to the upper electrode sections 223. In this case, the piezoelectric thin film section 222 contracts in the Z axis direction parallel to the polarization direction, and expands in the X axis and Y axis directions. As a result, the piezoelectric thin film section 222 formed on the main surface 41 expands the most largely in the Y axis direction. Thus, the oscillating arm 40 on which the piezoelectric thin film section 222 is formed displaces in a direction indicated by an arrow F6.

By the displacement of the oscillating arm 40 in the direction of the arrow F6, the piezoelectric thin film section 242 formed on the oscillating arm 40 contracts in the Y axis direction and expands in the X axis and Z axis directions. As a result, plus charges are generated on the lower electrode section 241, and minus charges are generated on the upper electrode section 243.

A fourth condition is now explained (not shown). In the fourth condition, voltage having the phase opposite to that of the voltage in the third condition is applied to the upper electrode sections and lower electrode sections. More specifically, minus voltage is applied to the lower electrode section 211 and the upper electrode section 223, and plus voltage is applied to the upper electrode section 213 and the lower electrode section 221.

The operation of the oscillating arm 30 is now explained. According to this structure, minus voltage is applied to the lower electrode section 211, and plus voltage is applied to the upper electrode sections 213. In this case, the piezoelectric thin film section 212 contracts in the Z axis direction parallel to the polarization direction, and expands in the X axis and Y axis directions. As a result, the piezoelectric thin film section 212 formed on the main surface 31 expands the most largely in the Y axis direction. Thus, the oscillating arm 30 on which the piezoelectric thin film section 212 displaces in a direction indicated by an arrow F7.

By the displacement of the oscillating arm 30 in the direction of the arrow F7, the piezoelectric thin film section 232 formed on the oscillating arm 30 contracts in the Y axis direction and expands in the X axis and Z axis directions. As a result, plus charges are generated on the lower electrode section 231, and minus charges are generated on the upper electrode section 233.

The operation of the oscillating arm 40 is now explained. According to this structure, plus voltage is applied to the lower electrode section 221, and minus voltage is applied to the upper electrode sections 223. In this case, the piezoelectric thin film section 222 expands in the Z axis direction parallel to the polarization direction, and contracts in the X axis and Y axis directions. The piezoelectric thin film section 222 formed on the main surface 41 contracts the most largely in the Y axis direction. Thus, the oscillating arm 40 on which the piezoelectric thin film section 222 is formed displaces in a direction indicated by an arrow F8.

By the displacement of the oscillating arm 40 in the direction of the arrow F8, the piezoelectric thin film section 242 formed on the oscillating arm 40 expands in the Y axis direction and contracts in the X axis and Z axis directions. As a result, minus charges are generated on the lower electrode section 241, and plus charges are generated on the upper electrode section 243.

The following advantage is offered according to the second embodiment as well as the advantages provided by the first embodiment.

According to the second embodiment, only one drive element and one detection element are provided on each of the oscillating arms 30 and 40. Thus, manufacture of the drive element and detection element is easier than that in the first embodiment.

Modified Example

A modified example of the second embodiment is now described.

Figure 10:
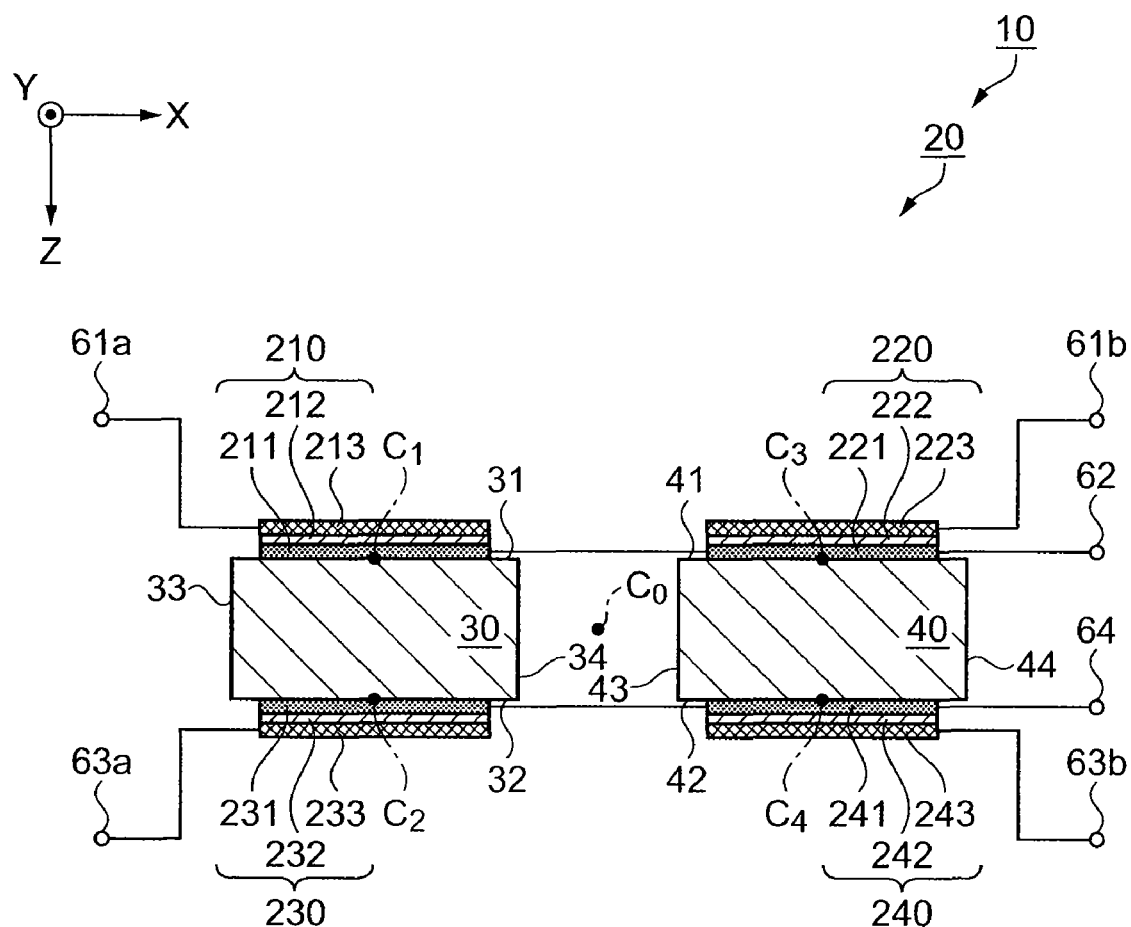
FIG. 10 illustrates connections of respective piezoelectric thin film elements in a modified example of the second embodiment.

FIG. 10 illustrates connections of respective piezoelectric thin film elements in the modified example of the second embodiment. The connections between the electrode sections of the drive elements and between the electrode sections of the detection elements of the piezoelectric thin film crystal oscillating piece 10 in the modified example are sequentially explained with reference to FIG. 10.

As for the drive elements, the lower electrode sections 211 and 221 are connected with one another, and joined to the connection pin 62. The upper electrode section 213 is connected with the connection pin 61a. The upper electrode section 223 is connected with the connection pin 61b.

As for the detection elements, the lower electrode sections 231 and 241 are connected with one another, and joined to the connection pin 64. The upper electrode section 233 is connected with the connection pin 63a. The upper electrode section 243 is connected with the connection pin 63b.

The connection pins 61a, 61b, 63a, and 63b are connected with the amplifier. The connection pin 62 is so constructed as to have voltage equivalent to that of the connection pin 64.

The oscillation of the piezoelectric thin film crystal oscillating piece 10 is now described.

FIGS. 11A and 11B schematically illustrate oscillation of the piezoelectric thin film crystal oscillating piece 10. FIG. 11A is a cross-sectional view taken along the line B-B in FIG. 7, and FIG. 11B schematically shows the oscillation direction of the piezoelectric thin film crystal oscillating piece 10. The parts different from those in the second embodiment are chiefly explained herein.

The modified example is different from the second embodiment in that the respective lower electrode sections of the respective oscillating arms have equivalent voltage.

A third condition is now explained with reference to FIGS. 11A and 11B.

Ground voltage is applied to the lower electrode sections 211 and 221. Minus voltage on the minus side of the ground voltage is applied to the upper electrode section 213. Plus voltage on the plus side of the ground voltage is applied to the upper electrode section 223.

In this case, the polarization direction of the piezoelectric thin film sections 212, 222, 232, and 242 corresponds to the thickness direction of the piezoelectric thin film sections 212, 222, 232 and 242 as indicated by the arrows $P_0$ similarly to the second embodiment.

Thus, the oscillating arm 30 displaces in the direction indicated by the arrow F5 similarly to the second embodiment. By the displacement of the oscillating arm 30 in the direction of the arrow F5, the piezoelectric thin film section 232 formed on the oscillating arm 30 expands in the Y axis direction and contracts in the X axis and Z axis directions.

As a result, ground charges are generated on the lower electrode section 231, and plus charges on the plus side of the ground charges are generated on the upper electrode section 233.

Similarly to the second embodiment, the oscillating arm 40 displaces in the direction indicated by the arrow F6.

By the displacement of the oscillating arm 40 in the direction of the arrow F6, the piezoelectric thin film section 242 formed on the oscillating arm 40 contracts in the Y axis direction and expands in the X axis and Z axis directions.

As a result, ground charges are generated on the lower electrode section 241, and minus charges on the minus side of the ground charges are generated on the upper electrode section 243.

A fourth condition is now discussed.

In the fourth condition, ground voltage is applied to the lower electrode sections 211 and 221, and voltage having the phase opposite to that in the third condition is applied to the upper electrode sections 213 and 223. In this case, the oscillating arm 30 displaces in the direction indicated by the arrow F7, and the oscillating arm 40 displaces in the direction indicated by the arrow F8 similarly to the fourth condition in the second embodiment.

By the displacement of the oscillating arm 30 in the direction of the arrow F7, ground charges are generated on the lower electrode section 231, and minus charges on the minus side of the ground charges are generated on the upper electrode section 233. By the displacement of the oscillating arm 40 in the direction of the arrow F8, ground charges are generated on the lower electrode section 241, and plus charges on the plus side of the ground charges are generated on the upper electrode section 243.

According to the modified example of the second embodiment, advantages similar to those provided in the modified example of the first embodiment can be offered.

Third Embodiment

Figure 12:
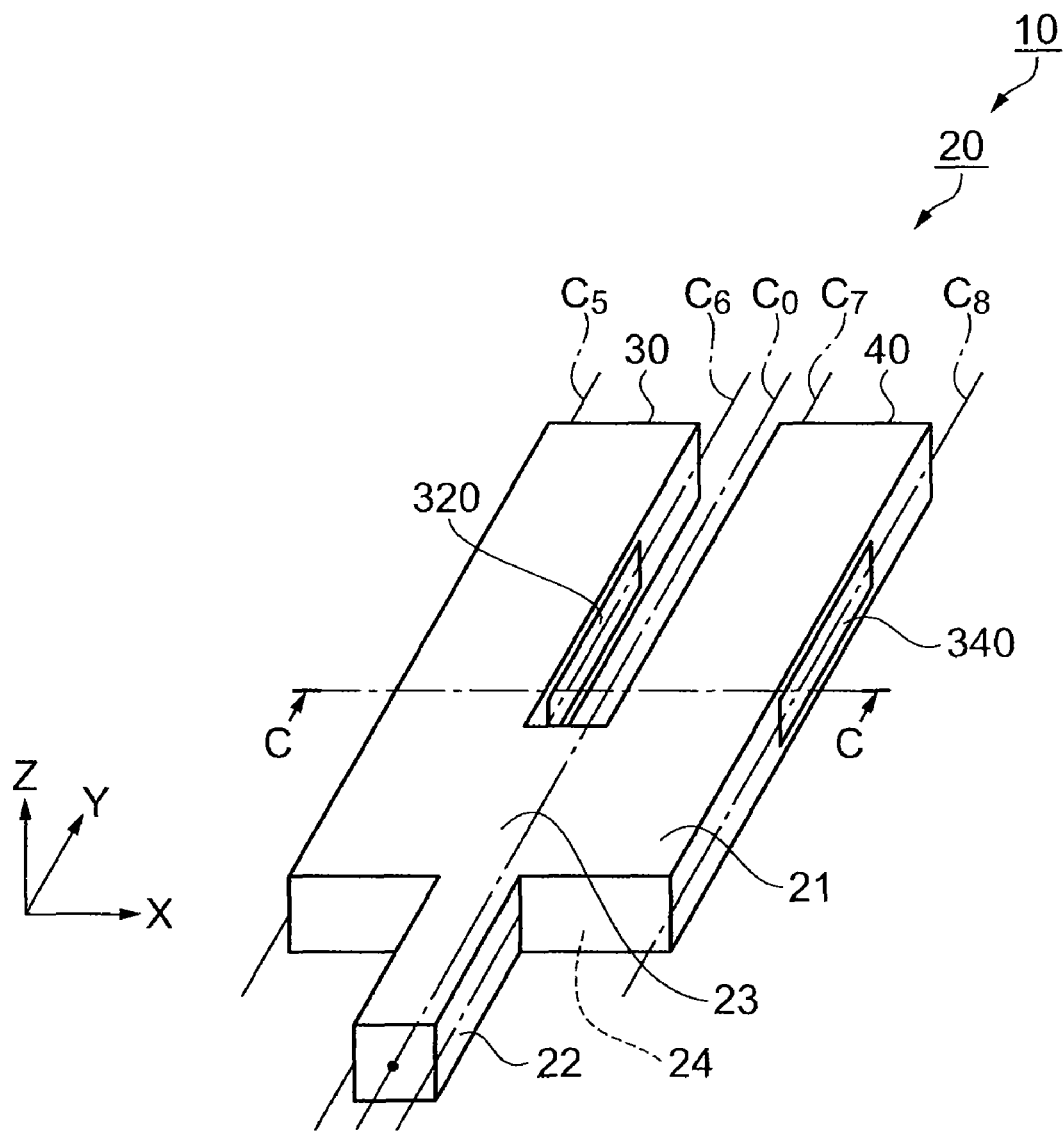
FIG. 12 is a perspective view showing a piezoelectric thin film tuning fork oscillating piece according to a third embodiment.
Figure 13:
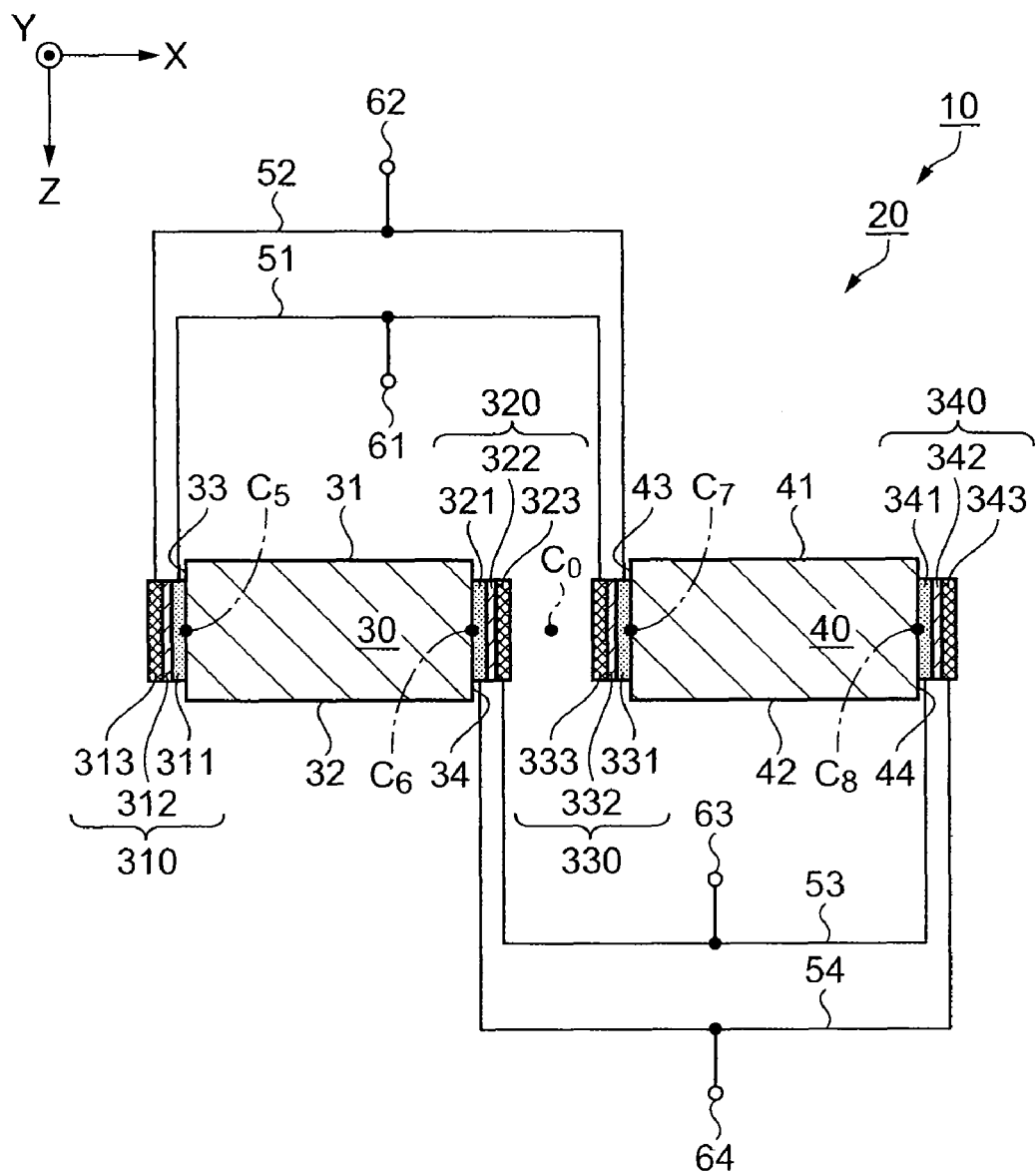
FIG. 13 is a cross-sectional view taken along a line C-C in FIG. 12, showing connections between respective piezoelectric thin film elements.

In this embodiment, the same explanation as that in the above embodiments is not repeated, and only different points are described. FIG. 12 is a perspective view illustrating a piezoelectric thin film tuning fork oscillating piece in a third embodiment. FIG. 13 is a cross-sectional view taken along a line C-C in FIG. 12, illustrating connections of respective piezoelectric thin film elements.

As illustrated in FIGS. 12 and 13, a piezoelectric thin film element 310 has a substantially rectangular flat shape which is substantially linear-symmetric with respect to the side center line C5 on the side surface 33 in the Y axis direction. A piezoelectric thin film element 320 has a substantially rectangular flat shape which is substantially linear-symmetric with respect to the side center line C6 on the side surface 34 in the Y axis direction.

A piezoelectric thin film element 330 has a substantially rectangular flat shape which is substantially linear-symmetric with respect to the side center line C7 on the side surface 43 in the Y axis direction.

A piezoelectric thin film element 340 has a substantially rectangular flat shape which is substantially linear-symmetric with respect to the side center line C8 on the side surface 44 in the Y axis direction.

The method for determining which of the piezoelectric thin film elements 310, 320, 330, and 340 are used as the drive elements or the detection elements is now discussed. Table 3 shows the positioning of the drive elements and detection elements on the respective side surfaces.

TABLE 3

| crystal oscillating piece 10 | piezoelectric thin film element | | | |
|---|---|---|---|---|
| sample No. | 310 | 320 | 330 | 340 |
| 16 | drive element | detect element | drive element | detect element |

TABLE 3-continued

| crystal oscillating piece 10 | piezoelectric thin film element | | | |
|---|---|---|---|---|
| sample No. | 310 | 320 | 330 | 340 |
| 17 | drive element | detect element | detect element | drive element |
| 18 | detect element | drive element | drive element | detect element |
| 19 | detect element | drive element | detect element | drive element |

In this embodiment, the piezoelectric thin film elements 310, 320, 330, and 340 are determined as the drive elements or detection elements as shown in Sample Nos. 16 through 19 in Table 3 to produce the piezoelectric thin film crystal oscillating piece 10.

The piezoelectric thin film crystal oscillating piece 10 of sample No. 16 is now discussed as a typical example. This piezoelectric thin film crystal oscillating piece 10 has the piezoelectric thin film elements 310 and 330 as the drive elements, and the piezoelectric thin film elements 320 and 340 as the detection elements.

The piezoelectric thin film crystal oscillating piece 10 has the piezoelectric thin film element 310 as the drive element on the side surface 33, and the piezoelectric thin film element 330 as the drive element on the side surface 43. Also, the piezoelectric thin film crystal oscillating piece 10 has the piezoelectric thin film element 320 as the detection element on the side surface 34, and the piezoelectric thin film element 340 as the detection element on the side surface 44.

According to the piezoelectric thin film crystal oscillating piece 10 having this arrangement, the piezoelectric thin film elements 310 and 330 as the drive elements are opposed to the piezoelectric thin film elements 320 and 340 as the detection elements.

The connection between the electrode sections of the drive elements and the connection between the electrode sections of the detection elements are now sequentially described with reference to FIG. 13.

As for the drive elements, the lower electrode section 311, the upper electrode section 333, and the connection pin 61 are connected via the connection electrode 51. The upper electrode section 313 and the lower electrode section 331 having polarity opposite to that of the electrode sections 311, 333, and the connection pin 62 are connected via the connection electrode 52.

As for the detection elements, the lower electrode section 321, the upper electrode section 343, and the connection pin 64 are connected via the connection electrode 54. The upper electrode section 323 and the lower electrode section 341 having polarity opposite to that of the electrode sections 321 and 343, and the connection pin 63 are connected via the connection electrode 53.

The oscillation of the piezoelectric thin film crystal oscillating piece 10 is now discussed. FIGS. 14A and 14B schematically illustrate oscillation direction of the piezoelectric thin film crystal oscillating piece 10. FIG. 14A is a cross-sectional view taken along a line C-C in FIG. 12, and FIG. 14B schematically illustrates oscillation direction of the piezoelectric thin film crystal oscillating piece 10.

A fifth condition is now explained with reference to FIGS. 14A and 14B. Plus voltage is applied to the lower electrode section 311 and the upper electrode section 333, and minus voltage is applied to the upper electrode section 313 and the lower electrode section 331. In this case, the polarization direction of the piezoelectric thin film sections 312, 322, 332, and 342 corresponds to the thickness direction of the piezoelectric thin film sections 312, 322, 332, and 342 in the direction indicated by the arrows $P_0$.

The operation of the oscillating arm 30 is now explained. According to this structure, plus voltage is applied to the lower electrode section 311, and minus voltage is applied to the upper electrode sections 313. In this case, the piezoelectric thin film section 312 expands in the X axis direction parallel to the polarization direction, and contracts in the Z axis and Y axis directions. As a result, the piezoelectric thin film section 312 formed on the side surface 33 contracts the most largely in the Y axis direction. Thus, the oscillating arm 30 on which the piezoelectric thin film section 312 is formed displaces in a direction indicated by an arrow F9.

By the displacement of the oscillating arm 30 in the direction of the arrow F9, the piezoelectric thin film section 322 formed on the oscillating arm 30 expands in the Y axis direction and contracts in the X axis and Z axis directions. As a result, minus charges are generated on the lower electrode section 321, and plus charges are generated on the upper electrode section 323.

The operation of the oscillating arm 40 is now explained. According to this structure, minus voltage is applied to the lower electrode section 331, and plus voltage is applied to the upper electrode sections 333. In this case, the piezoelectric thin film section 332 contracts in the X axis direction parallel to the polarization direction, and expands in the Z axis and Y axis directions. The piezoelectric thin film section 332 formed on the side surface 43 expands the most largely in the Y axis direction. Thus, the oscillating arm 40 on which the piezoelectric thin film section 332 is formed displaces in a direction indicated by an arrow F10.

By the displacement of the oscillating arm 40 in the direction of the arrow F10, the piezoelectric thin film section 342 formed on the oscillating arm 40 contracts in the Y axis direction and expands in the X axis and Z axis directions. As a result, plus charges are generated on the lower electrode section 341, and minus charges are generated on the upper electrode section 343.

A sixth condition is now explained (not shown in the drawing). In the sixth condition, voltage having the phase opposite to that of the voltage in the fifth condition is applied to the respective upper electrode sections and lower electrode sections. More specifically, minus voltage is applied to the lower electrode section 311 and the upper electrode section 333, and plus voltage is applied to the upper electrode section 313 and the lower electrode section 331.

The operation of the oscillating arm 30 is now explained. According to this structure, minus voltage is applied to the lower electrode section 311, and plus voltage is applied to the upper electrode sections 313. In this case, the piezoelectric thin film section 312 contracts in the X axis direction parallel to the polarization direction, and expands in the Z axis and Y axis directions. In this case, the piezoelectric thin film section 312 formed on the side surface 33 expands the most largely in the Y axis direction. Thus, the oscillating arm 30 on which the piezoelectric thin film section 312 is formed displaces in a direction indicated by an arrow F11.

By the displacement of the oscillating arm 30 in the direction of the arrow F11, the piezoelectric thin film section 322 formed on the oscillating arm 30 contracts in the Y axis direction and expands in the X axis and Z axis directions. As a result, plus charges are generated on the lower electrode section 321, and minus charges are generated on the upper electrode section 323.

The operation of the oscillating arm 40 is now explained. According to this structure, plus voltage is applied to the lower electrode section 331, and minus voltage is applied to the upper electrode sections 333. In this case, the piezoelectric thin film section 332 expands in the X axis direction parallel to the polarization direction, and contracts in the Z axis and Y axis directions. The piezoelectric thin film section 332 formed on the side surface 43 contracts the most largely in the Y axis direction. Thus, the oscillating arm 40 on which the piezoelectric thin film section 332 is formed displaces in a direction indicated by an arrow F12.

By the displacement of the oscillating arm 40 in the direction of the arrow F12, the piezoelectric thin film section 342 formed on the oscillating arm 40 expands in the Y axis direction and contracts in the X axis and Z axis directions. As a result, minus charges are generated on the lower electrode section 341, and plus charges are generated on the upper electrode section 343.

The advantages provided according to the first and second embodiments can be offered in the third embodiment.

Modified Example

A modified example of the third embodiment is now described.

Figure 15:
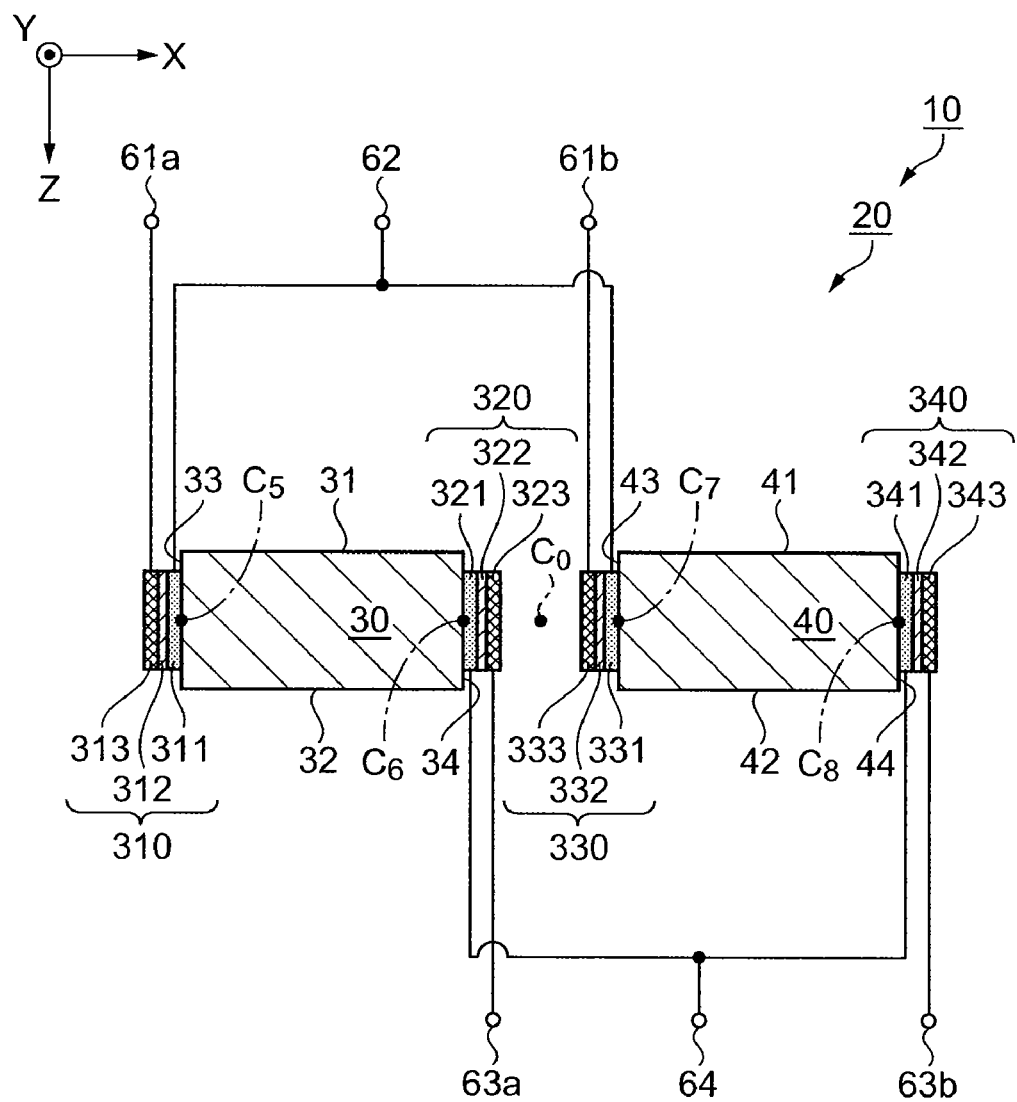
FIG. 15 illustrates connections of respective piezoelectric thin film elements in a modified example of the third embodiment.

FIG. 15 illustrates connections of respective piezoelectric thin film elements in the modified example of the third embodiment. The connections between the electrode sections of the drive elements and between the electrode sections of the detection elements of the piezoelectric thin film crystal oscillating piece 10 in the modified example are sequentially explained with reference to FIG. 15.

As for the drive elements, the lower electrode sections 311 and 331 are connected with one another, and joined to the connection pin 62. The upper electrode section 313 is connected with the connection pin 61a. The upper electrode section 333 is connected with the connection pin 61b.

As for the detection elements, the lower electrode sections 321 and 341 are connected with one another, and joined to the connection pin 64. The upper electrode section 323 is connected with the connection pin 63a. The upper electrode section 343 is connected with the connection pin 63b.

The connection pins 61a, 61b, 63a, and 63b are connected with the amplifier. The connection pin 62 is so constructed as to have voltage equivalent to that of the connection pin 64.

Oscillation of the piezoelectric thin film crystal oscillating piece 10 is now described.

FIGS. 16A and 16B schematically illustrate oscillation of the piezoelectric thin film crystal oscillating piece 10. FIG. 16A is a cross-sectional view taken along the line C-C in FIG. 12, and FIG. 16B schematically shows the oscillation direction of the piezoelectric thin film crystal oscillating piece 10. The parts different from those in the third embodiment are chiefly explained herein.

The difference between the modified example and the third embodiment is that the voltages of the respective lower electrode sections on the respective oscillating arms are equivalent to each other.

A fifth condition is now explained with reference to FIGS. 16A and 16B.

Ground voltage is applied to the lower electrode sections 311 and 331, plus voltage on the plus side of the ground voltage is applied to the upper electrode 333, and minus voltage on the minus side of the ground voltage is applied to the upper electrode section 313.

In this case, the polarization direction of the piezoelectric thin film sections 312, 322, 332, and 342 corresponds to the thickness direction of the piezoelectric thin film sections 312, 322, 332 and 342 as indicated by the arrows $P_0$ similarly to the third embodiment.

Thus, the oscillating arm 30 displaces in the direction indicated by the arrow F9 similarly to the third embodiment. By the displacement of the oscillating arm 30 in the direction of the arrow F9, the piezoelectric thin film section 322 formed on the oscillating arm 30 expands in the Y axis direction and contracts in the X axis and Z axis directions. As a result, ground charges are generated on the lower electrode section 321, and plus charges on the plus side of the ground charges are generated on the upper electrode section 323.

Similarly to the third embodiment, the oscillating arm 40 displaces in the direction indicated by the arrow F10.

By the displacement of the oscillating arm 40 in the direction of the arrow F10, the piezoelectric thin film section 342 formed on the oscillating arm 40 contracts in the Y axis direction and expands in the X axis and Z axis directions. As a result, ground charges are generated on the lower electrode section 341, and minus charges on the minus side of the ground charges are generated on the upper electrode section 343.

A sixth condition is now discussed.

In the sixth condition, ground voltage is applied to he lower electrode sections 311 and 331, and voltage having the phase opposite to that in the fifth condition is applied to the upper electrode sections 333 and 313. In this case, the oscillating arm 30 displaces in the direction indicated by the arrow F11, and the oscillating arm 40 displaces in the direction indicated by the arrow F12 similarly to the sixth condition in the third embodiment.

By the displacement of the oscillating arm 30 in the direction of the arrow F11, ground charges are generated on the lower electrode section 321, and minus charges on the minus side of the ground charges are generated on the upper electrode section 323. By the displacement of the oscillating arm 40 in the direction of the arrow F12, ground charges are generated on the lower electrode section 341, and plus charges on the plus side of the ground charges are generated on the upper electrode section 343.

According to the modified example of the third embodiment, advantages similar to those provided in the modified example of the first embodiment can be offered.

The embodiments and modified examples described herein may be practiced otherwise, and it is thus intended that various modifications and changes may be made without departing from the scope and spirit of the invention. For example, the tuning fork oscillating piece body may be made of other materials having permanent elasticity such as various types of metal, silicon or other semi-metal or other semiconductor, glass, quartz, and gallium phosphate. When the tuning fork oscillating piece body is made of metal, an insulation film is provided between the tuning fork oscillating piece body and the formed piezoelectric thin film element.

The number of the piezoelectric thin film elements may be four or a larger even number for each main surface or side surface.

The piezoelectric thin film crystal oscillating pieces 10 of sample Nos. 7 through 13 may be provided on the main surface 31 or main surface 41, and the main surface 32 or main surface 42. Also, two or a larger even number of the drive elements, and two or a larger even number of the detection elements may be provided for each of the main surface 31 or main surface 41, and the main surface 32 or main surface 42.

Each flat shape of the piezoelectric thin film elements may be polygon elongated in one direction or track circle other than elliptic or substantially rectangular shape.

The piezoelectric thin film sections of the drive elements may be made of BT (barium titanate), KN (potassium niobate), or others.

The piezoelectric thin film sections of the detection elements may be made of AlN, crystal, LN (lithium niobate), LT (lithium tantalate), or others.

The lower electrode sections of the detection elements may be made of Pt, Al, or others.

The upper electrode sections of the drive elements and the detection elements may be made of Cr, Ti, Ni, Cu, Ag, Au, or others.

Films of the drive elements and detection elements may be formed by dry deposition, ion-plating, CVD (chemical vapor deposition), wet printing, or other methods.

The polarization directions of the respective piezoelectric thin film sections may be inclined to the thickness direction. Also, the polarization directions of the respective piezoelectric thin films may be arbitrary directions on the flat surfaces of the respective piezoelectric thin film sections.

The connections with the amplifier may be made through the connection pins 62 and 64. Also, one connection with the amplifier may be made through the connection pin 61, and the other connection may be through the connection pin 64. Alternatively, one connection with the amplifier may be made through the connection pin 62, and the other may be through the connection pin 63. In this case, CMOS inverter is employed in place of the amplifier, for example.

Piezoelectric Thin Film Tuning Fork Oscillator

The piezoelectric thin film crystal oscillator as piezoelectric thin film tuning fork oscillator including any of the piezoelectric thin film crystal oscillating pieces 10 according to the respective embodiments and modified examples is now described.

Figure 17:
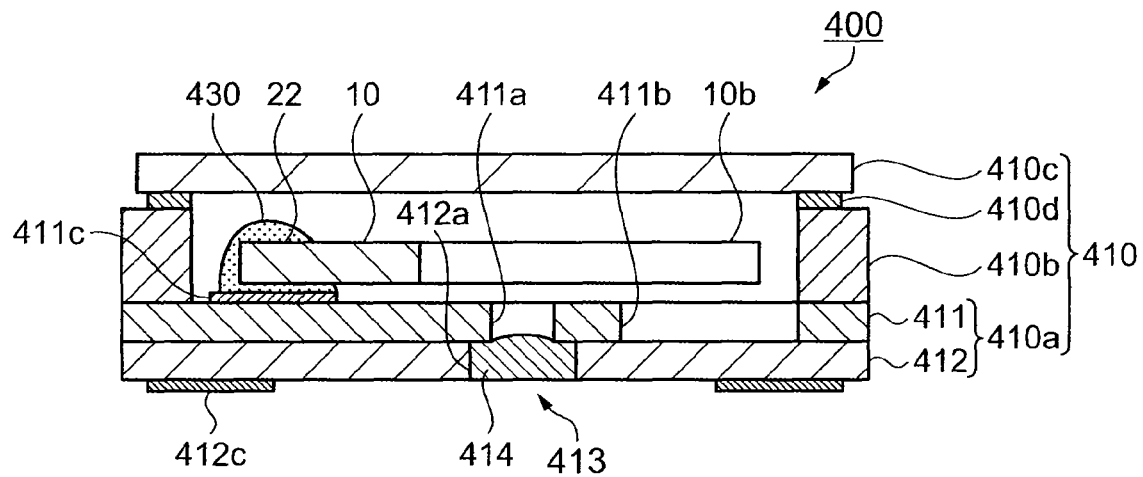
FIG. 17 is a cross-sectional view showing an example of a general structure of a piezoelectric thin film crystal oscillator.

FIG. 17 is a cross-sectional view schematically illustrating an example of the piezoelectric thin film crystal oscillator.

As illustrated in FIG. 17, a piezoelectric thin film crystal oscillator 400 includes the piezoelectric thin film crystal oscillating piece 10, and a package 410 for accommodating the piezoelectric thin film crystal oscillating piece 10 in the hermetically sealed interior of the package 410.

The package 410 has a base 410a, a frame 410b, a cover 410c, a joint 410d, and other parts.

Two layers 411 and 412 of the base 410a are constituted by aluminum oxide sintered body formed by molding and burning ceramic green sheet, or other materials.

An electrode 411c made of metal coating is provided on the first layer 411 of the base 410a, and the piezoelectric thin film crystal oscillating piece 10 is mounted on the electrode 411c such that a not-shown extension electrode section is positioned on the electrode 411c. The support member 22 of the piezoelectric thin film crystal oscillating piece 10 is electrically connected with the electrode 411c and fixed thereto via the extension electrode section by conductive adhesive 430 or the like.

A through hole 411a is formed on the first layer 411.

An opening 411b is formed on the first layer 411 at a position overlapping with an end 10b of the piezoelectric thin film crystal oscillating piece 10 in the plan view. According to the piezoelectric thin film crystal oscillator 400 having this structure, it is possible to prevent contact between the end 10b of the piezoelectric thin film crystal oscillating piece 10 and the first layer 411 of the base 410a caused by the bending of the piezoelectric thin film crystal oscillating piece 10 produced by a shock from the outside or the like. The opening 411b may be eliminated.

A mounting pin 412c made of metal coating is formed on the outer surface of the second layer 412 of the base 410a. This mounting pin 412c is connected with the electrode 411c via a not-shown internal wiring of the base 410a. A through hole 412a larger than the through hole 411a on the second layer 412 is formed at a position overlapping with the through hole 411a of the first layer 411.

The frame 410b having a frame shape and surrounding the piezoelectric thin film crystal oscillating piece 10 is laminated on the base 410a. The frame 410b is constituted by aluminum oxide sintered body formed by molding and burning ceramic green sheet, or other materials similar to the base 410a.

The cover 410c is provided on the frame 410b in such a manner as to cover the piezoelectric thin film crystal oscillating piece 10. The cover 410c is made of metal such as Kovar, and joined to the frame 410b via the joint 410d similarly made of metal such as Kovar by seam welding, brazing, or other methods.

According to the piezoelectric thin film crystal oscillator 400, a seal portion 413 for hermetically sealing the package 410 is formed by the through holes 411a and 412a. In the piezoelectric thin film crystal oscillator 400, sealing material 414 made of Au—Ge alloy or the like is injected into the seal portion 413.

In this structure, the inside of the package 410 of the piezoelectric thin film crystal oscillator 400 is hermetically sealed. The inside of the package 410 may be sealed by other deactivated gas such as nitrogen, helium, and argon, or vacuumed.

The cover 410c of the package 410 of the piezoelectric thin film crystal oscillator 400 may be made of glass as well as metal such as Kovar. In this case, low-melting-point glass is used as the material of the joint 410d such that the cover 410c and the frame 410b can be joined when the low-melting-point glass is melted.

As discussed above, the piezoelectric thin film crystal oscillator 400 has the piezoelectric thin film crystal oscillating piece 10, and the package 410 for accommodating the piezoelectric thin film crystal oscillating piece 10 in the hermetically sealed interior of the package 410. Since the piezoelectric thin film crystal oscillating piece 10 is contained in the hermetically sealed package 410 in the piezoelectric thin film crystal oscillator 400, stable bending oscillation of the piezoelectric thin film crystal oscillating piece 10 can be maintained.

Acceleration Sensor

An acceleration sensor including the piezoelectric thin film crystal oscillating piece 10 as the piezoelectric thin film tuning fork oscillating piece according to any of the respective embodiments and modifications is now described.

Figure 18:
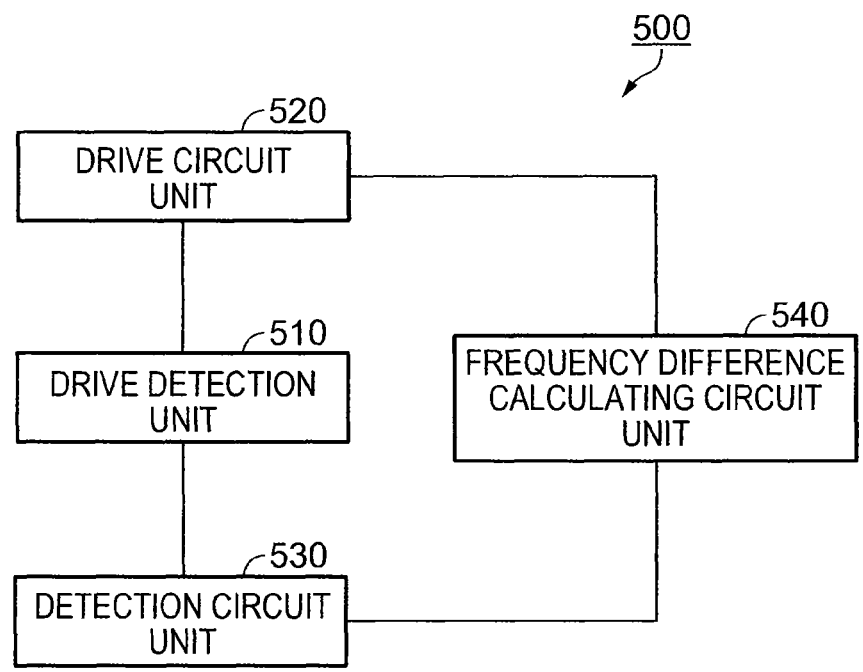
FIG. 18 is a block diagram showing an example of a general structure of an acceleration sensor.

FIG. 18 is a block diagram showing an example of a general structure of an acceleration sensor.

As illustrated in FIG. 18, an acceleration sensor 500 includes a drive detection unit 510, a drive circuit unit 520, a detection circuit unit 530, a frequency difference calculating circuit unit 540, and other components.

The drive detection unit 510 includes the piezoelectric thin film crystal oscillating piece 10 according to any of the embodiments and modifications herein as an acceleration detecting element.

According to the acceleration sensor 500, a drive signal is outputted from the drive circuit unit 520, and the piezoelectric thin film crystal oscillating piece 10 of the drive detection unit 510 performs bending oscillation at a fixed frequency f0.

When acceleration is applied to the piezoelectric thin film crystal oscillating piece 10 of the acceleration sensor 500 in the oscillation direction, the frequency of the bending oscillation of the piezoelectric thin film crystal oscillating piece 10 changes to a frequency f.

The detection circuit unit 530 of the acceleration sensor 500 detects the frequency f0 and the frequency f, and outputs the result as the detection signal.

The frequency difference calculating circuit unit 540 of the acceleration sensor 500 calculates a frequency difference $\Delta f$ ($\Delta f = f0 - f$) between the frequency f0 before change and frequency f after change based on this detection signal, and then outputs the calculation result by voltage or the like.

The acceleration sensor 500 may store the correlation between the frequency difference and acceleration in the not-shown memory unit, calculate acceleration by a not-shown calculating unit based on the calculated frequency difference $\Delta f$, and then outputs the acceleration. The function of the memory unit may be provided by a capacitor.

As discussed above, the drive detection unit 510 of the acceleration sensor 500 includes the piezoelectric thin film crystal oscillating piece 10 as the acceleration detecting element. Thus, the changes in the bending oscillations of the respective oscillating arms of the piezoelectric thin film crystal oscillating piece 10 caused by applied acceleration can be efficiently converted into changes in charges by using the respective piezoelectric thin film sections as the detection elements. Thus, the acceleration sensor 500 can detect applied acceleration with high sensitivity.

The entire disclosure of Japanese Patent Application No. 2008-183508, filed Jul. 15, 2008 is expressly incorporated by reference herein.

What is claimed is:

1. A tuning fork oscillating piece, comprising:
   a pair of oscillating arms extending substantially parallel with each other;
   a base having the pair of oscillating arms;
   two drive piezoelectric elements provided on each of the oscillating arms to allow bending oscillation of the oscillating arms by piezoelectric distortion caused by applied charge;
   two detection piezoelectric elements provided on each of the oscillating arms to convert the piezoelectric distortion caused by the bending oscillation of the oscillating arms into charge and output the charge,
   wherein the drive piezoelectric elements each have a drive piezoelectric section,
   wherein the detection piezoelectric elements each have a detection piezoelectric section,
   wherein the absolute value of the piezoelectric d constant, which is the piezoelectric strain constant, of the drive piezoelectric sections is larger than the absolute value of the piezoelectric d constant of the detection piezoelectric sections, and
   wherein the absolute value of the piezoelectric g constant, which is the piezoelectric output constant, of the detection piezoelectric sections is larger than the absolute value of the piezoelectric g constant of the drive piezoelectric sections;
   and wherein each oscillating arm comprises two opposing main surfaces, wherein two of the piezoelectric elements are provided on each main surface of each oscillating arm, wherein one piezoelectric element is provided on each of the inner side and outer side of a main surface center line in an extension direction of each main surface of each oscillating arm.

2. The tuning fork oscillating piece according to claim 1, wherein the four drive piezoelectric elements are provided on one main surface of both oscillating arms, and wherein the four detection piezoelectric elements are provided on the other main surface of both oscillating arms.

3. The tuning fork oscillating piece according to claim 1, wherein the voltages of the drive piezoelectric element and the detection piezoelectric element on the side contacting the oscillating arm are equivalent to each other.

4. A tuning fork oscillator, comprising:
   the tuning fork oscillating piece according to claim 1; and
   a package which accommodates the tuning fork oscillating piece in a hermetically sealed interior of the package.

5. An acceleration sensor, comprising the tuning fork oscillating piece according to claim 1 as an acceleration detecting element.

6. The tuning fork oscillating piece according to claim 1, wherein a first one of the oscillating arms comprises a first and second opposing main surface, wherein two of the drive piezoelectric elements are provided on the first main surface and two of the detection piezoelectric elements are provided on the second main surface.

7. The tuning fork oscillating piece according to claim 6, wherein a second one of the oscillating arms comprises a third and fourth opposing main surface, wherein two of the drive piezoelectric elements are provided on the third main surface and two of the detection piezoelectric elements are provided on the fourth main surface.

8. The tuning fork oscillating piece according to claim 6, wherein a second one of the oscillating arms comprises a third and fourth opposing main surface, wherein one of the drive piezoelectric elements and one of the driven piezoelectric elements are provided on the third main surface and one of the drive piezoelectric elements and one of the driven piezoelectric elements are provided on the fourth main surface.

9. The tuning fork oscillating piece according to claim 1, wherein a first one of the oscillating arms comprises a first and second opposing main surface, wherein one of the drive piezoelectric elements and one of the driven piezoelectric elements are provided on the first main surface and one of the drive piezoelectric elements and one of the driven piezoelectric elements are provided on the second main surface.

10. The tuning fork oscillating piece according to claim 9, wherein a second one of the oscillating arms comprises a third and fourth opposing main surface, wherein two of the drive piezoelectric elements are provided on the third main surface and two of the detection piezoelectric elements are provided on the fourth main surface.

11. The tuning fork oscillating piece according to claim 9, wherein a second one of the oscillating arms comprises a third and fourth opposing main surface, wherein one of the drive piezoelectric elements and one of the driven piezoelectric elements are provided on the third main surface and one of the drive piezoelectric elements and one of the driven piezoelectric elements are provided on the fourth main surface.

* * * * *